(12) United States Patent
Motz et al.

(10) Patent No.: US 12,222,384 B2
(45) Date of Patent: Feb. 11, 2025

(54) CIRCUITS AND METHODS FOR DETECTING LINE SHORT CIRCUITS AND/OR LINE INTERRUPTIONS IN DIFFERENTIALLY OPERATED LINE NETWORKS

(71) Applicant: Infineon Technologies AG, Neubiberg (DE)

(72) Inventors: Mario Motz, Wernberg (AT); Florian Brugger, Villach (AT); Carlos Humberto Garcia Rojas, Villach (AT); Francesco Polo, Arnoldstein (AT); Tobias Werth, Villach (AT)

(73) Assignee: Infineon Technologies AG, Neubiberg (DE)

( * ) Notice: Subject to any disclaimer, the term of this patent is extended or adjusted under 35 U.S.C. 154(b) by 583 days.

(21) Appl. No.: 17/452,284

(22) Filed: Oct. 26, 2021

(65) Prior Publication Data

US 2022/0137122 A1 May 5, 2022

(30) Foreign Application Priority Data

Oct. 30, 2020 (DE) .......................... 102020128590.6
Mar. 31, 2021 (DE) .......................... 102021108192.0

(51) Int. Cl.
*G01R 31/28* (2006.01)
*G01D 5/20* (2006.01)
(Continued)

(52) U.S. Cl.
CPC .......... *G01R 31/2829* (2013.01); *G01D 5/20* (2013.01); *G01R 31/006* (2013.01); *H02H 1/0007* (2013.01)

(58) Field of Classification Search
CPC .. G01R 31/2829; G01R 31/006; G01R 31/52; G01R 31/54; G01R 31/58; G01D 5/20;
(Continued)

(56) References Cited

U.S. PATENT DOCUMENTS 5,777,468 A 7/1998 Maher
8,914,249 B2 * 12/2014 Imaizumi ............... G01R 27/02
324/715

(Continued)

FOREIGN PATENT DOCUMENTS

CA 2694886 A1 * 9/2010 ............. G01V 13/00
CN 107645342 A 1/2018
(Continued)

OTHER PUBLICATIONS

Machine translation of CN-1467481-A (Year: 2004).*
Machine translation of JP-2009033014-A (Year: 2009).*
Machine translation of JP-2004264154-A (Year: 2004).*

*Primary Examiner* — Jean B Corrielus
(74) *Attorney, Agent, or Firm* — Harrity & Harrity, LLP

(57) ABSTRACT

The present disclosure relates to circuits for detecting a line short circuit and/or a line interruption in a differentially operated line network, comprising at least one control circuit configured to control at least one common-mode signal of the differentially operated line network vis-à-vis a predefined common-mode signal variable and to indicate a line short circuit and/or a line interruption in the differentially operated line network if at least one control or controlled variable of the control circuit exceeds a predefined threshold value.

31 Claims, 23 Drawing Sheets

(51) Int. Cl.
*G01R 31/00* (2006.01)
*H02H 1/00* (2006.01)

(58) Field of Classification Search
CPC ...... G01D 3/08; G01D 5/2073; G01D 5/2046; H02H 1/0007
See application file for complete search history.

(56) References Cited

U.S. PATENT DOCUMENTS

| | | |
|---|---|---|
| 10,090,922 B2 | 10/2018 | Ray |
| 10,541,608 B1 | 1/2020 | Chao |
| 11,169,218 B2 | 11/2021 | Wan et al. |
| 2005/0094737 A1* | 5/2005 | Vorenkamp ............. H04L 25/08 375/257 |
| 2009/0085573 A1* | 4/2009 | Blakely .................. G01R 31/52 324/509 |
| 2009/0184718 A1* | 7/2009 | Ivan ........................ B60K 6/46 324/522 |
| 2019/0170078 A1* | 6/2019 | Nishimura ............ H01F 7/1805 |

FOREIGN PATENT DOCUMENTS

| | | |
|---|---|---|
| CN | 110658878 A | 1/2020 |
| CN | 111355456 A | 6/2020 |
| EP | 3524988 A1 | 8/2019 |
| GB | 1279005 A | 6/1972 |
| JP | 2013024800 A | 2/2013 |

\* cited by examiner

CIRCUITS AND METHODS FOR DETECTING LINE SHORT CIRCUITS AND/OR LINE INTERRUPTIONS IN DIFFERENTIALLY OPERATED LINE NETWORKS

CROSS REFERENCE TO RELATED APPLICATIONS

This application claims priority to German Patent Application No. 102020128590.6, filed on Oct. 30, 2020, and German Patent Application No. 102021108192.0, filed on Mar. 31, 2021, the contents of which are incorporated by reference herein in their entirety.

TECHNICAL FIELD

The present disclosure relates to circuits and methods for detecting line short circuits and/or line interruptions in differentially operated line networks such as can be used for example in systems where functional safety is of importance, for example for safety-relevant electrical/electronic systems in motor vehicles.

BACKGROUND

A differentially operated line network usually makes use of symmetrical signal transmission in order to be able to communicate signals with as much tolerance as possible vis-à-vis interference radiation. In this case, the transmission is effected using not just a single signal conductor but rather a pair of signal conductors of identical type, which are also referred to here as signal cores. In the case of symmetrical signal transmission, the actual useful signal is superposed on a common-mode signal. Voltage signals in common-mode form may be referred to as common-mode voltages. In the case of currents, the term common-mode current may be employed. Common-mode signals for symmetrical signal transmission may be DC voltages or DC currents, while useful signals may be complementary AC voltages or currents superposed on the common-mode signal.

Line short circuits and/or line interruptions in a differentially operated line network may result in faults that cannot be identified straightforwardly without suitable measures. This may be the case, for example, for sensor circuits, such as inductive angle sensors, for example, where a measurement variable is generally not known beforehand. Line short circuits and/or line interruptions here may result in corrupted measurement signals, for example, the naïve further processing of which could entail fatal consequences under certain circumstances, particularly in the case of safety-relevant systems.

SUMMARY

Some aspects described herein relate to circuits and methods able to identify line short circuits and/or line interruptions in a differentially operated line network.

In accordance with a first aspect of the present disclosure, a circuit for detecting a line short circuit and/or a line interruption in a differentially operated line network is proposed. The circuit comprises at least one control circuit configured to control at least one common-mode signal of the differentially operated line network vis-à-vis a predefined common-mode signal variable and to indicate a line short circuit and/or a line interruption in the differentially operated line network if at least one control or controlled variable exceeds a predefined threshold value. Example implementations of the proposed circuit can be used, for example, where functional safety is important, such as in safety-relevant electrical/electronic systems in motor vehicles, for example.

In accordance with some example implementations, the inductive angle sensor is configured as an analog control circuit which processes and outputs value- and time-continuous signals.

In accordance with some example implementations, the (analog) control circuit as controller has a transconductance amplifier (referred to as Operational-Transconductance-Amplifier, OTA) having at least one feedback output for at least one control current. In some aspects, the feedback output feeds the control current back to a common-mode signal source of the differentially operated line network and/or at least to a signal line of the differentially operated line network. The common-mode signal source can thus be a common-mode voltage source or common-mode current source that is controlled by the control current by way of open-loop or closed-loop control. Additionally, or alternatively, the control current can be injected directly into signal lines of the differentially operated line network.

In accordance with some example implementations, the transconductance amplifier has a plurality of feedback outputs for a plurality of signal lines of the differentially operated line network. Thus, for example, a respective control current can be injected directly into a positive and a negative signal core of the differentially operated line network.

In accordance with some example implementations, the transconductance amplifier has exactly one feedback output for the common-mode signal source. That is advantageous, for example, if the control current controls a common-mode signal source by way of open-loop/closed-loop control, the source respectively supplying a common-mode signal for a positive and a negative signal core of the differentially operated line network.

In accordance with some example implementations, the control circuit furthermore has a current comparison circuit configured to compare a control current provided via the at least one feedback output of the transconductance amplifier with at least one predefined threshold current provided via at least one current source, and to indicate a line short circuit and/or a line interruption in the differentially operated line network if the control current exceeds the predefined threshold current in terms of absolute value. The current comparison circuit can thus compare a control current (output current of the transconductance amplifier) provided by a current source of the transconductance amplifier with a threshold current provided by a comparison current source.

In accordance with some example implementations, the control circuit has a detection circuit configured to ascertain whether one or more transistors of at least one current source of the transconductance amplifier for providing a control current via the feedback output leaves its/their saturation region, and to indicate a line short circuit and/or a line interruption in the differentially operated line network if the saturation region is left. The detection circuit can thus be configured to identify if an output transistor of the transconductance amplifier changes from the saturated region of the transistor characteristic curve (analog operating range) to the unsaturated region, sometimes also called "digital operating range" or "switch operation". A condition for saturation (analog operating range with high gain) of a transistor is $V_{DS} > V_{GS} - V_{th}$. In other words, $V_{DS}$ must be greater than the gate voltage (minus the $V_{th}$, threshold voltage). In the event of the analog operating range being left, a line short circuit and/or a line interruption in the differentially operated line network can then be indicated.

In accordance with some example implementations, the control circuit is configured at least partly as a digital control circuit.

In accordance with some example implementations, the (digital) control circuit comprises an analog-to-digital converter (ADC), the inputs of which are coupled to a differentially operated line pair of the line network, a digital signal processing circuit configured to compare common-mode signals of the differentially operated line pair that have been subjected to analog-to-digital conversion using the ADC with a common-mode signal setpoint variable and to determine a digital control signal in response thereto, and a feedback path for the digital control signal with a digital-to-analog converter (DAC), for controlling the common-mode signal source of the differentially operated line pair.

In accordance with some example implementations, the circuit furthermore comprises at least one injection current source configured to inject, in addition to the common-mode signal (for example a common-mode voltage), at least one predefined DC current or AC current into the differentially operated line network without the injected DC or AC current affecting differential signal routing. This can be achieved, for example, by providing currents having different signs for different signal lines. Injecting a predefined current enables line short circuits and/or line interruptions to be detected even more rapidly.

In accordance with some example implementations, the at least one injection current source is configured as switchable, in order to be applied alternately to different signal lines of the differentially operated line network and to inject a DC current there. Fault causes can thus be identified in a more detailed manner.

In accordance with some example implementations, the differentially operated line network comprises a differentially operated LC exciter resonant circuit of an inductive angle sensor. Inductive sensors operate with an inductance (open exciter coil), a magnetic field is generated and a rotor with an inductive target arrangement changes the field, as a result of which in turn induction signals are generated in a sensor coil arrangement. A rotation angle of the rotor can then be deduced by evaluating the induction signals. This inductive measurement principle enables angles, displacements or distances and speeds to be measured in a non-contact manner and without wear.

In accordance with some example implementations, the differentially operated line network comprises a plurality of differentially operated sensors coils of an inductive angle sensor. It is thus possible not only to detect line short circuits and/or line interruptions on the part of the LC exciter resonant circuit, but additionally, or alternatively, also to detect line short circuits and/or line interruptions on the part of the sensor coils. The greater the number of line short circuits and/or line interruptions that can be detected at different points, the greater the number of qualitative statements that can be made about a fault in the differentially operated line network.

In accordance with a further aspect of the present disclosure, an inductive angle sensor with detection of line short circuits and/or line interruptions is proposed. The inductive angle sensor comprises an LC exciter resonant circuit differentially operated using an integrated oscillator circuit, and a control circuit configured to control a common-mode signal for the differentially operated LC exciter resonant circuit vis-à-vis a predefined common-mode signal variable and to indicate a line short circuit and/or a line interruption in the differentially operated LC exciter resonant circuit if at least one control signal exceeds a predefined threshold value.

In some example implementations, the oscillator circuit can be integrated in an application-specific integrated circuit (ASIC), whereas the LC exciter resonant circuit is implemented outside the ASIC on a printed circuit board.

In accordance with some example implementations, the control circuit has a transconductance amplifier coupled to the differentially operated LC exciter resonant circuit on the input side and having at least one feedback output for a control current which is fed back to the integrated oscillator circuit (in an ASIC, for example) and/or to at least one signal line situated on a printed circuit board of the differentially operated LC exciter resonant circuit.

In accordance with some example implementations, the transconductance amplifier has a feedback output for each signal conductor of a signal line pair of the differentially operated LC exciter resonant circuit. Additionally, or alternatively, the transconductance amplifier has exactly one feedback output for the integrated oscillator circuit in order to control the common-mode signal based on the control signal fed to the oscillator circuit.

In accordance with some example implementations, the control circuit comprises an ADC, the input of which is coupled to a line pair of the differentially operated LC exciter resonant circuit, a digital signal processing circuit configured to compare common-mode signals of the line pair that have been subjected to analog-to-digital conversion using the ADC with a common-mode signal setpoint variable and to determine a digital control signal in response thereto, and a feedback path for the digital control signal with a DAC, for converting the digital control signal into an analog control current for the integrated oscillator circuit.

In accordance with some example implementations, the control circuit furthermore comprises for each signal conductor of a signal line pair of the differentially operated LC exciter resonant circuit, a DC current source configured to inject, in addition to the common-mode signal, a DC current into the respective signal conductor, without affecting differential signal routing in the differentially operated LC exciter resonant circuit.

In accordance with yet another aspect of the present disclosure, a further inductive angle sensor with detection of line short circuits and/or line interruptions is proposed. The inductive angle sensor comprises a plurality of differentially operated sensor coils arranged in a phase-offset manner, and a control circuit configured to control at least one common-mode signal of the differentially operated sensor coils vis-à-vis a predefined common-mode signal variable and to indicate a line short circuit and/or a line interruption for the differentially operated sensor coils if at least one control signal of the control circuit exceeds a predefined threshold value.

In accordance with some example implementations, the inductive angle sensor comprises for each of the differentially operated sensor coils, a DC current source configured to inject, in addition to the respective common-mode signal, a predefined (e.g., constant) DC current into the respective signal line, without affecting differential signal routing in the plurality of differentially operated sensor coils.

In accordance with some example implementations, each of the DC current sources is switchable alternately to different sensor coils from among the differentially operated sensor coils. It is thus possible to ascertain even more accurately what fault is present in the circuit.

In accordance with some example implementations, the control circuit has a transconductance amplifier coupled to the differentially operated sensor coils on the input side and having at least one feedback output for a control current which is fed back to at least one signal line of the differentially operated sensor coils.

In accordance with some example implementations, the feedback Output is switchable alternately to different sensor coils from among the differentially operated sensor coils. It is thus possible to ascertain even more accurately what fault is present in the circuit.

In accordance with some example implementations, the inductive angle sensor comprises an evaluation circuit, which is coupled to the differentially operated sensor coils arranged in a phase-offset manner and is configured to determine a rotation angle of an inductive rotor arrangement based on induction signals of the sensor coils.

In accordance with some example implementations, the evaluation circuit is furthermore configured to indicate, based on the controlled common-mode signals of the differentially operated sensor coils arranged in a phase-offset manner, a line short circuit and/or a line interruption for the sensor coils if at least one of the controlled common-mode signals leaves a predefined tolerance range.

In accordance with a further aspect, an inductive angle sensor having at least one differentially operated coil (e.g., an exciter coil and/or a sensor coil) is proposed. The angle sensor furthermore comprises an injection current source configured to inject a DC current into the differentially operated coil. The angle sensor furthermore comprises a registering circuit configured to determine a voltage drop across terminals (for example, soldered joints) of the coil that is caused by the DC current. It is thereby possible to identify for example an increased line resistance in coils of inductive angle sensors.

In accordance with a further aspect, an inductive angle sensor is proposed which comprises an oscillator circuit configured to differentially operate an LC exciter resonant circuit with an exciter coil. The angle sensor furthermore comprises an injection current source configured to inject a DC current into the differentially operated LC exciter resonant circuit or the exciter coil. The angle sensor furthermore comprises a registering circuit configured to determine a voltage drop across terminals of the exciter coil that is caused by the DC current. It is thereby possible to identify for example an increased line resistance in exciter coils of inductive angle sensors.

In accordance with some example implementations, the injection current source is configured to inject the DC current into the differentially operated LC exciter resonant circuit without the injected DC current affecting differential signal routing. For this purpose, the DC current should be able to flow away from the LC exciter resonant circuit.

In accordance with some example implementations, the registering circuit is configured to output a fault signal if the voltage drop across the terminals of the exciter coil exceeds a predefined threshold value. This may be, for example, an indication of a high electrical resistance caused by the terminals and/or the exciter coil. An accuracy of the angle sensor may be adversely affected as a result. If the voltage drop, and thus the electrical resistance, are too high, this may be, for example, an indication of faulty soldered joints at the terminals of the exciter coil.

In accordance with some example implementations, the registering circuit has an (e.g., RC) low-pass filter configured to suppress AC signals (e.g., AC exciter signals) of the oscillator circuit.

In accordance with some example implementations, the inductive angle sensor furthermore comprises a control circuit configured to control a common-mode signal for the differentially operated LC exciter resonant circuit via-á-vis a predefined common-mode signal variable and to indicate a line short circuit and/or a line interruption in the differentially operated LC exciter resonant circuit if at least one control or controlled variable exceeds a predefined threshold value. The identification of increased line resistance in exciter coils for inductive sensors can thus readily be combined with the identification of line short circuits and/or line interruptions.

In accordance with a further aspect, an inductive angle sensor is proposed which comprises at least one differentially operated sensor coil. The angle sensor furthermore comprises an injection current source configured to inject a DC current into the differentially operated sensor coil. The angle sensor furthermore comprises a registering circuit configured to determine a voltage drop across terminals of the sensor coil that is caused by the DC current. It is thereby possible to identify, for example, an increased line resistance in sensor coils of inductive angle sensors.

In accordance with some example implementations, the injection current source is configured to inject the DC current into the differentially operated sensor coil without the injected DC current affecting differential signal routing. For this purpose, the DC current should be able to flow away from the at least one differentially operated sensor coil.

In accordance with some example implementations, the registering circuit is configured to output a fault signal if the voltage drop across the terminals of the sensor coil exceeds a predefined threshold value. This may be, for example, an indication of a high electrical resistance caused by the terminals and/or the sensor coil. An accuracy of the angle sensor may be adversely affected as a result. If the voltage drop, and thus the electrical resistance, are too high, this may be, for example, an indication of faulty soldered joints at the terminals of the sensor coil.

In accordance with some example implementations, the registering circuit has an (e.g., RC) low-pass filter configured to suppress AC signals (e.g., AC exciter signals of an exciter resonant circuit).

In accordance with some example implementations, the inductive angle sensor furthermore comprises a demodulator circuit arranged between the terminals of the coil and the registering circuit and configured, in a first operating mode for angle measurement, during a first switching phase, to switch a first terminal of the sensor coil to a first input of the registering circuit and a second terminal of the sensor coil to a second input of the registering circuit and, during a second switching phase, to switch the first terminal of the sensor coil to the second input of the registering circuit and the second terminal of the sensor coil to the first input of the registering circuit. The demodulator circuit is configured, in a second operating mode for determining the voltage drop across terminals of the sensor coil, to switch the first terminal of the sensor coil permanently to the first input of the registering circuit and the second terminal of the sensor coil permanently to the second input of the registering circuit.

In accordance with some example implementations, the inductive angle sensor furthermore comprises a control circuit configured to control at least one common-mode signal of the differentially operated sensor coil vis-à-vis a predefined common-mode signal variable and to indicate a line short circuit and/or a line interruption for the differentially operated sensor coil if at least one control or controlled variable exceeds a predefined threshold value. The identification of increased line resistance in sensor coils for inductive sensors can thus readily be combined with the identification of line short circuits and/or line interruptions.

Furthermore, a method for detecting a line short circuit and/or a line interruption in a differentially operated line network is proposed. The method comprises controlling at least one common-mode signal of the differentially operated line network vis-à-vis a predefined common-mode signal variable and indicating a line short circuit and/or a line interruption in the differentially operated line network if at least one control or controlled variable exceeds a predefined threshold value.

Additionally, or alternatively, a method for identifying increased line resistance in at least one differentially operated current (e.g., an exciter coil and/or a sensor coil) for inductive angle sensors is proposed. The method comprises injecting a DC current into the differentially operated coil. The method furthermore comprises registering a voltage drop across terminals of the coil, the voltage drop being caused by the DC current.

Example implementations of the present disclosure enable in inductive angle sensors, for example, an identification of faults in the LC exciter resonant circuit, an identification of interruptions and short circuits, an identification of printed circuit board faults and functional safety including signaling of faults (internal and/or external evaluation) and an identification of circuit-internal faults such as, for example, bond wire breaks or circuit-internal short circuits. Some example implementations propose a use of (e.g., switchable) common-mode test current sources and at least one (analog or digital) common-mode control loop for identifying a common-mode or amplitude control overloading of the route(s) and thus for identifying short circuits and interruptions on a printed circuit board and in the sensor IC (the inductive sensor IC is connected to receiving and exciter coils on a printed circuit board).

BRIEF DESCRIPTION OF THE DRAWINGS

Some examples of devices and/or methods are explained in greater detail merely by way of example below with reference to the accompanying figures, in which.

DETAILED DESCRIPTION

Some implementations will now be described more thoroughly with reference to the accompanying figures. However, further possible implementations are not restricted to the features of these implementations described in detail. These may have modifications of the features and counterparts and alternatives to the features. Furthermore, the terminology used herein for describing specific implementations is not intended to be limiting for further possible implementations.

Throughout the description of the figures, identical or similar reference signs refer to identical or similar elements or features which can be implemented in each case identically or else in modified form, while they provide the same or a similar function. In the figures, furthermore, the thicknesses of lines, layers and/or regions may be exaggerated for elucidation purposes.

If two elements A and B are combined using an "or", this should be understood such that all possible combinations are disclosed, e.g. only A, only B, and A and B, unless expressly defined otherwise in an individual case. As alternative wording for the same combinations, it is possible to use "at least one from A and B" or "A and/or B". That applies equivalently to combinations of more than two elements.

If a singular form, e.g., "a," "an" and "the", is used and the use of only a single element is defined neither explicitly nor implicitly as obligatory, further implementations can also use a plurality of elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage describe the presence of the specified features, integers, steps, operations, processes, elements, components and/or a group thereof, but do not exclude the presence or the addition of one or more other features, integers, steps, operations, processes, elements, components and/or a group thereof.

The concept proposed herein for detecting a line short circuit and/or a line interruption in a differentially operated line network has, in principle, numerous possibilities for use in various electrical and/or electronic circuits. Therefore, the circuit concept disclosed herein is firstly presented very generally with reference to FIGS. 1A and 1B.

Figure 1A:
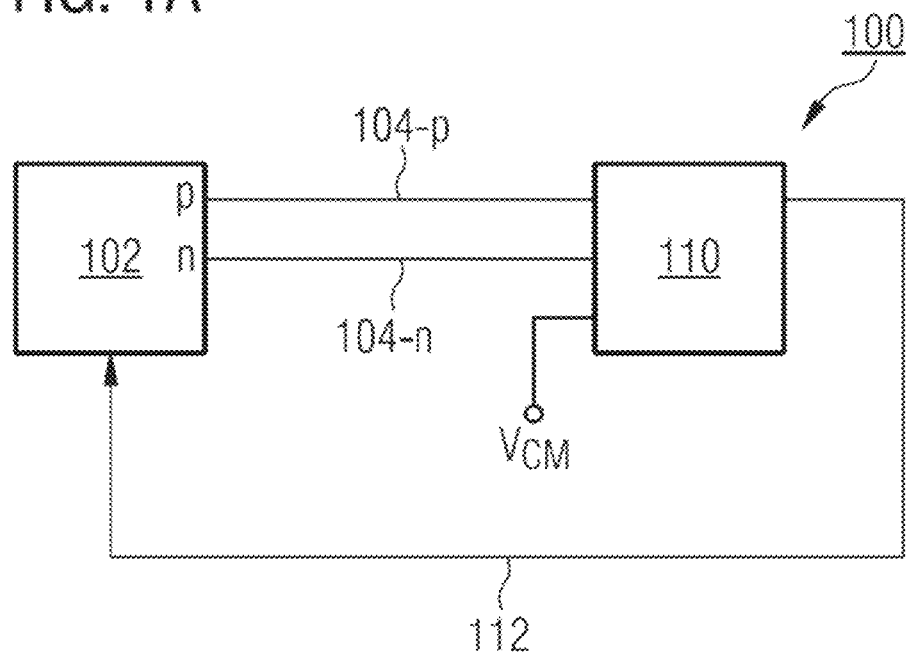
FIG. 1A shows a first example implementation of a circuit for detecting a line short circuit and/or a line interruption in a differentially operated line network.

FIG. 1A shows a circuit 100 for detecting a line short circuit and/or a line interruption in a differentially operated line network.

The circuit 100 comprises a signal source 102 for a differentially routed signal. The differentially routed signal is provided via a core pair 104-$p$ and 104-$n$. That is to say that, for example, a differential voltage as useful signal can be provided via the core pair 104-$p$, 104-$n$. In addition, the signal source 102 can provide a common-mode signal, such as a common-mode voltage, for example. In the case of a line interruption of one of the two signal lines 104-$p$, 104-$n$ and/or a short circuit, errors occur during the differential signal transmission and may have an effect at other locations of the line network. In order to be able to ascertain such errors, the circuit 100 comprises a control circuit 110 configured to control the common-mode signal of the differentially operated line network, the common-mode signal being provided via the signal lines 104-$p$, 104-$n$, vis-à-vis a predefined common-mode signal variable $V_{CM}$ and to indicate a line short circuit and/or a line interruption in the differentially operated line network if at least one control variable 112 of the control circuit 110 exceeds a predefined threshold value. The control circuit 110 registers the common-mode signal as control variable and compares it with the setpoint common-mode signal $V_{CM}$. In the event of deviation, the control circuit 110 intervenes with the aid of the control variable 112. The control variable 112 can be a control voltage or a control current, depending on the application.

In the example implementation depicted schematically in FIG. 1A, the control variable 112 (e.g., control current or control voltage) acts directly on the signal source 102 in order to control the common-mode signal (e.g., common-mode current or common-mode voltage) provided by the signal source 102 to the desired setpoint value $V_{CM}$.

Figure 1B:
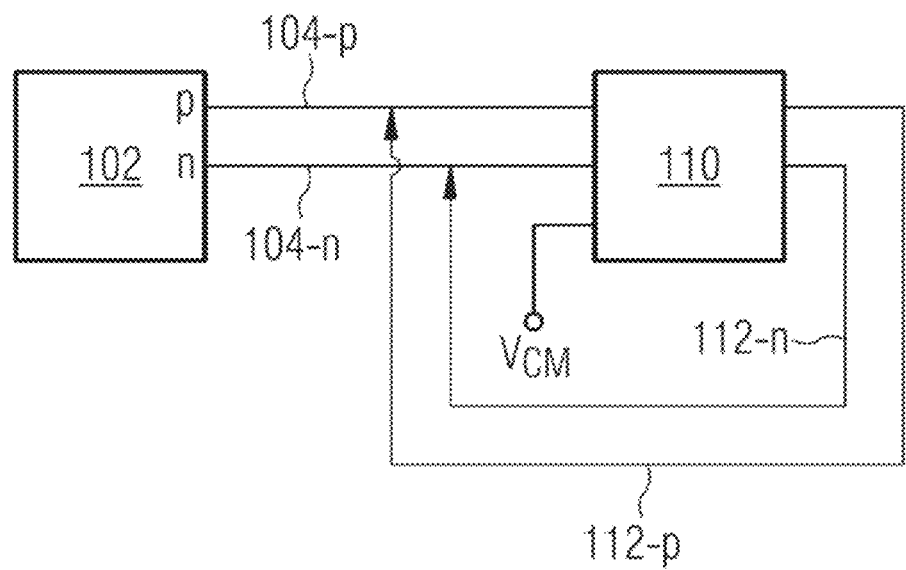
FIG. 1B shows a second example implementation of a circuit for detecting a line short circuit and/or a line interruption in a differentially operated line network.

In some implementations, as shown in FIG. 1B, the control circuit 110 has a first output for a first control variable 112-$p$ and a second output for a second control variable 112-$n$. The control variable 112-$p$ is fed back to the positive signal core 104-$p$, and the control variable 112-$n$ is fed back to the negative signal core 104-$n$. Here, too, the control variables 112 can be either control currents or control voltages depending on implementations.

The basic concept disclosed here consists in the fact that, in the case of a line short circuit and/or a line interruption, the control circuit 110 will no longer be able straightforwardly to control the common-mode signal to the predefined setpoint value $V_{CM}$. In the case of such a fault, it is to be expected that the control variable 112 provided by the control circuit 110 leaves a predetermined tolerance range and thus exceeds or falls below a threshold value. If this exceedance of the threshold value by the control variable 112 is ascertained, a line short circuit and/or a line interruption in the differentially operated line network can be deduced.

The concept proposed here may be of interest in particular for circuits in which functional safety is important. One example of such safety-relevant circuits is sensor circuits for motor vehicles. Sensor circuits are generally provided for measuring physical variables and instigating further actions based on the measured variables. Since such actions should also appropriately match the measured physical variable, it is often important for a sensor circuit to function without faults. In the case of differentially operated sensor circuits, such fault-free operation stipulates that signal lines in integrated circuits and/or on printed circuit boards have no line interruptions and/or line short circuits, since such faults can otherwise result in erroneous sensor signals and thus inappropriate actions or decisions.

One application example for the concept presented here is found in inductive angle sensors. As illustrated schematically in the side view in FIG. 2, an inductive angle sensor 200 has a stator 201 and a rotor 202 arranged rotatably relative to the stator. The inductive angle sensor 200 is configured to determine an actual or real rotation angle φ between the rotor 202 and the stator 201.

The stator 201 has an exciter resonant circuit 203. The exciter resonant circuit 203 can have at least one inductance, for example, a corresponding exciter coil 204. The exciter coil 204 is electrically conductive and can have one or more turns. The exciter coil 204 can also be referred to as an excitation coil. The exciter resonant circuit 203 can have an oscillator and optionally a resistance and/or a capacitance (not depicted). The stator 201 can furthermore have a (e.g., multi-phase) sensor coil arrangement 205, which can also be referred to as a receiving coil arrangement.

The rotor 202 arranged rotatably relative to the stator 201 can have at least one inductive target arrangement 206. The target arrangement 206 can likewise have a coil having one or more turns or be configured as such a coil. Alternatively, the target arrangement 206 can have a solid component, for example a stamped metal sheet, or be configured as such.

In some implementations, the exciter resonant circuit 203 or the exciter coil 204 and the sensor coil arrangement 205 and the target arrangement 206 can be arranged along a common rotation axis 209 or be arranged vertically one above another along the common rotation axis 209. In some implementations, the exciter coil 204 and the sensor coil arrangement 205 and the target arrangement 206 can be arranged concentrically around the common rotation axis 209. The respective diameters of the exciter coil 204 and of the pick-up coil arrangement 205 and of the target arrangement 206 can be different. By way of example, the diameter of the exciter coil 204 can be greater than the diameter of the sensor coil arrangement 205 and/or of the target arrangement 206.

In the case of a differentially operated circuit, the exciter resonant circuit 203 (e.g., the exciter coil 204) can be excitable with an AC current, superposed on a common-mode signal, or an AC voltage. In reaction to the AC current or the AC voltage, the exciter coil 204 can generate a magnetic field 214 that can be directed outward, and in some implementations, in the direction of the rotor 202. The target arrangement 206 arranged in or on the rotor 202 is magnetically coupled to the exciter coil 204 arranged in or on the stator 201. That is to say that the target arrangement 206 can receive the magnetic field 214 generated by the exciter coil 204, as a result of which in turn a corresponding induced current is induced in the target arrangement 206. The exciter coil 204 can be rotationally symmetrical. An induced current that is independent of the actual rotation angle φ of the rotor 202 relatively to the stator 201 thus flows in the target arrangement 206. For its part, the induced current induced in the target arrangement 206 in turn causes a magnetic field 216 in the target arrangement 206, which magnetic field can be directed outwards, and in some implementations, in the direction of the stator 201. The magnetic field 216 can have a magnetic field pattern that is dependent on the geometric shape of the target arrangement 206. That is to say that the magnetic field pattern generated can be fixedly coupled to the respective target arrangement 206.

The magnetic field 216 emanating from the target arrangement 206 can be received by the sensor coil arrangement 205 arranged in or on the stator 201. If the rotor 202 moves relative to the stator 201, the magnetic field 216 emanating from the target arrangement 206 or the corresponding magnetic field pattern also moves relative to the stator 201. That is to say that if an observer rotates synchronously with the target arrangement 206, the observer does not see a magnetic field change. In the stator 201, which is movable relative to the rotor 202, a magnetic field change is seen at a fixed location because the entire magnetic field pattern likewise moves. As a result, in differentially operated sensor coils of the sensor coil arrangement 205 that are arranged in a phase-offset manner, in reaction to the changing magnetic field 216, different induction signals, e.g., induced currents or induced voltages, are induced, based on which the rotation angle φ between the rotor 202 and the stator 201 can be determined by an evaluation circuit 108.

Figure 2:
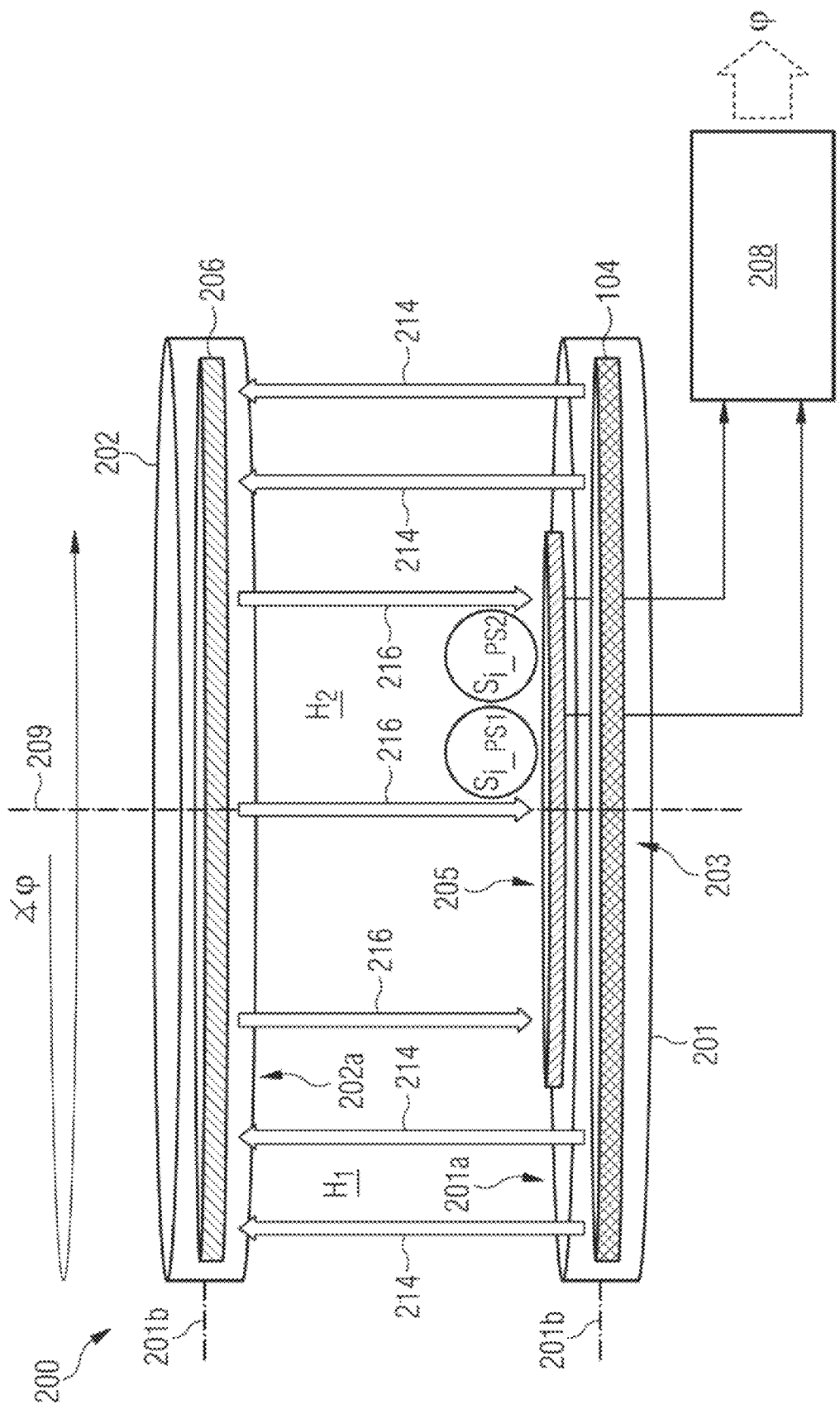
FIG. 2 shows a schematic side view of an inductive angle sensor.

Now that the basic mode of operation of an inductive angle sensor has been described with reference to FIG. 2, a circuitry set-up of a functionally safe inductive angle sensor 300 constructed with redundancy is depicted schematically in FIG. 3.

The differentially operated angle sensor 300 is constructed with redundancy for reasons of functional safety. For this purpose, differentially operated angle sensor 300 has a first integrated circuit 302-1, such as a first ASIC, for example. The first integrated circuit 302-1 has an integrated oscillator circuit, with which a first differentially operated exciter resonant circuit 203-1 can be operated. The first exciter resonant circuit 203-1 is illustrated here as an LC resonant circuit comprising the differentially operated exciter coil 204 and capacitances between the respective signal cores 104-p, 104-n and ground. The first integrated circuit 302-1 furthermore has a first integrated evaluation circuit, which is coupled to differentially operated first sensor coils of a first sensor coil arrangement 205-1, the first sensor coils being arranged in a phase-offset manner. The first integrated evaluation circuit is configured to determine a first rotation angle $\varphi_1$ between the rotor 202 and the stator based on the induction signals of the first sensor coil arrangement 205-1. Besides the first integrated circuit 302-1, the differentially operated angle sensor 300 furthermore has a second integrated circuit 302-2, such as a second ASIC, for example. The second integrated circuit 302-2 has a second integrated oscillator circuit, with which a second differentially operated exciter resonant circuit 203-2 can be operated. The second exciter resonant circuit 203-2 is also illustrated as an LC resonant circuit having the differentially operated exciter coil 204 and further capacitances between the respective signal cores 104-p, 104-n and ground. In the example implementation shown in FIG. 3, the two exciter resonant circuits 203-1, 203-2 share the exciter coil 204. The second integrated circuit 302-2 furthermore has a second integrated evaluation circuit, which is coupled to differentially operated second sensor coils of a second sensor coil arrangement 205-2, the second sensor coils being arranged in a phase-offset manner. The second integrated evaluation circuit is configured to determine a second rotation angle $\varphi_2$ between the rotor 202 and the stator based on the induction signals of the second sensor coil arrangement 205-2. During fault-free operation, the redundantly determined rotation angles $\varphi_1$ and $\varphi_2$ of the functionally safe inductive angle sensor 300 should turn out to be identical.

Figure 3:
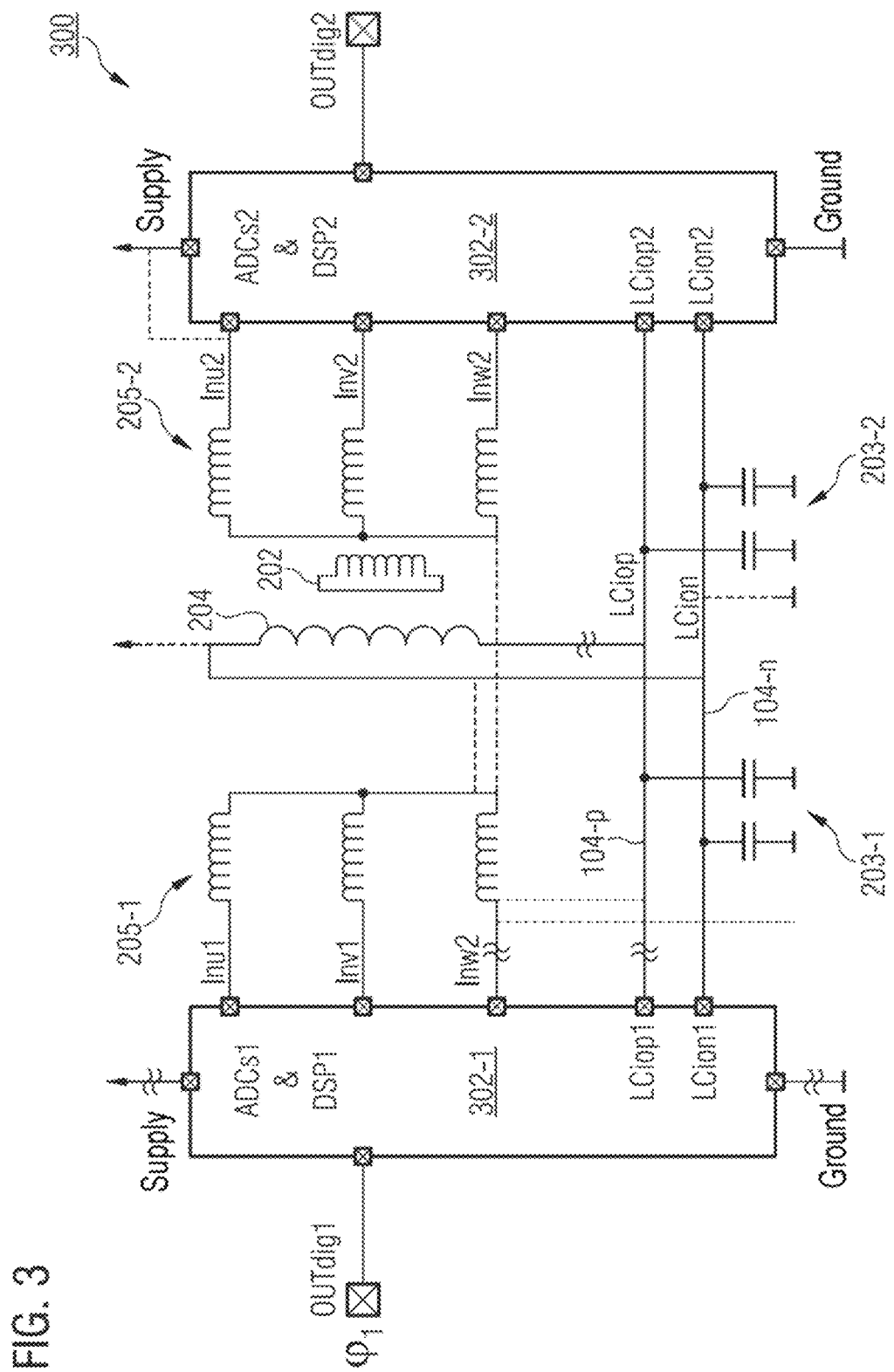
FIG. 3 shows open-circuit and short-circuit faults in a functionally safe inductive sensor system.

Line interruptions and/or short circuits are illustrated schematically at some locations in FIG. 3. By way of example, it is possible for a line interruption to occur in the positive signal core 104-p. Additionally, or alternatively, the negative signal core 104-n could be short-circuited with ground. As is furthermore indicated in FIG. 3, a line interruption could occur at the exciter coil 204. A line interruption between an integrated circuit (ASIC) 302-1, 302-2 and supply voltage is likewise possible. Furthermore, a line short circuit between supply voltage and a sensor coil is also possible. Such line interruptions and/or line short circuits can result in erroneous calculations of the first and second rotation angles $\varphi_1$ and $\varphi_2$. Therefore, it would be desirable to be able to ascertain line short circuits and/or interruptions precisely in functionally safe systems.

Figure 4:
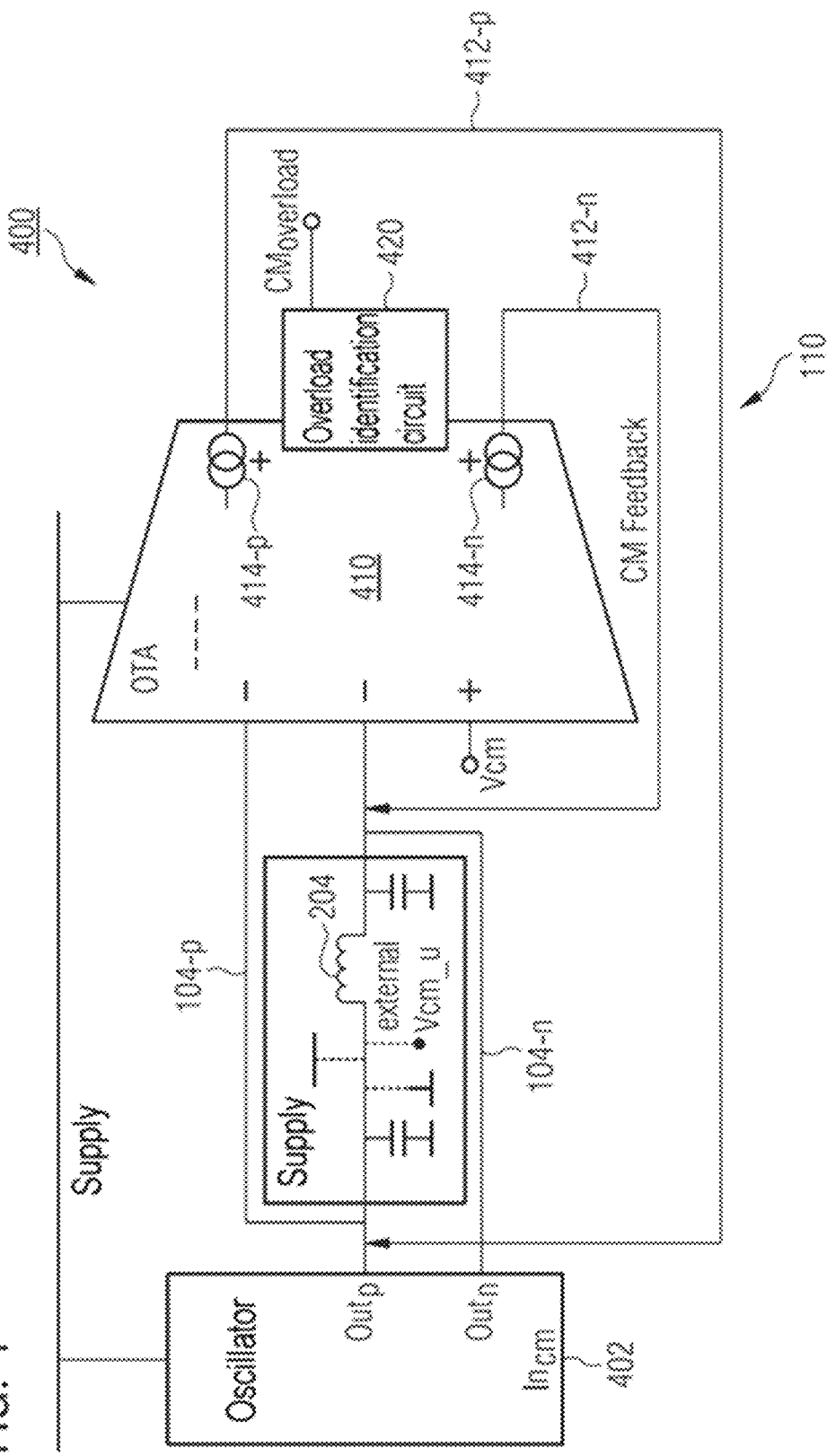
FIG. 4 shows open-circuit and short-circuit identification for oscillator and LC components (on printed circuit board (PCB)) using overload identification with an analog common-mode control loop in accordance with one example implementation.

FIG. 4 shows one example implementation of the present disclosure, in which the signals of the differential core pair 104-p, 104-n of the exciter resonant circuit 203 are fed to an analog control circuit in order to control the common-mode signals of the core pair 104-p, 104-n to a predetermined setpoint value $V_{CM}$.

In this example implementation, the signal source 402 is an integrated oscillator circuit, which can be part of the integrated circuit 302-1 or 302-2, for example. The differentially operated line network shown here is thus, for example, the first differentially operated exciter resonant circuit 203-1 or the second differentially operated exciter resonant circuit 203-2 of the inductive angle sensor circuit shown in FIG. 3. As is indicated schematically, line short circuits can occur at various locations in the exciter resonant circuit 203.

In accordance with FIG. 4, both the positive signal core 104-*p* and the negative signal core 104-*n* of the differentially operated exciter resonant circuit 203 can be coupled to a respective inverting input of a transconductance amplifier 410. A common-mode signal setpoint value $V_{CM}$ can be fed to a non-inverting input of the transconductance amplifier 410. Examples of a common-mode signal setpoint value are 0.8V, 1V, or 1.2V DC common-mode voltage. In the example implementation shown in FIG. 4, the transconductance amplifier 410 has a first non-inverting output for a first control current 412-*p* for the positive signal core 104-*p* and a second non-inverting output for a second control current 412-*n* for the negative signal core 104-*n*. Output current sources 414 for the two control currents 412-*p*, 412-*n* that are integrated into the transconductance amplifier 410 can be constructed in a similar manner to current sources within the oscillator circuit 402. The transconductance amplifier 410 here attempts to control the average voltage value of the two signal cores 104-*p*, 104-*n* to the common-mode signal setpoint value $V_{CM}$.

As long as short circuits or interruptions of the signal cores 104-*p*, 104-*n* do not occur, the transconductance amplifier will be able to supply control currents 412-*p*, 412-*n* that are in each case in a predefined tolerance range. In the case of short circuits or line interruptions in the differentially operated exciter resonant circuit 203, the disturbance-free control range of the transconductance amplifier is left and the control currents 412-*p*, 412-*n* exceed predefined threshold values in terms of absolute value. It should be mentioned here that control currents 412 can flow both out of and into the transconductance amplifier 410 (e.g., can have different signs). The circuit 400 illustrated schematically in FIG. 4, furthermore, has a detection circuit section 420 configured to ascertain and indicate an instance of the control currents 412-*p*, 412-*n* exceeding threshold values in terms of absolute value. This then in turn allows short circuits or interruptions of the signal cores 104-*p*, 104-*n* to be deduced.

Figure 5:
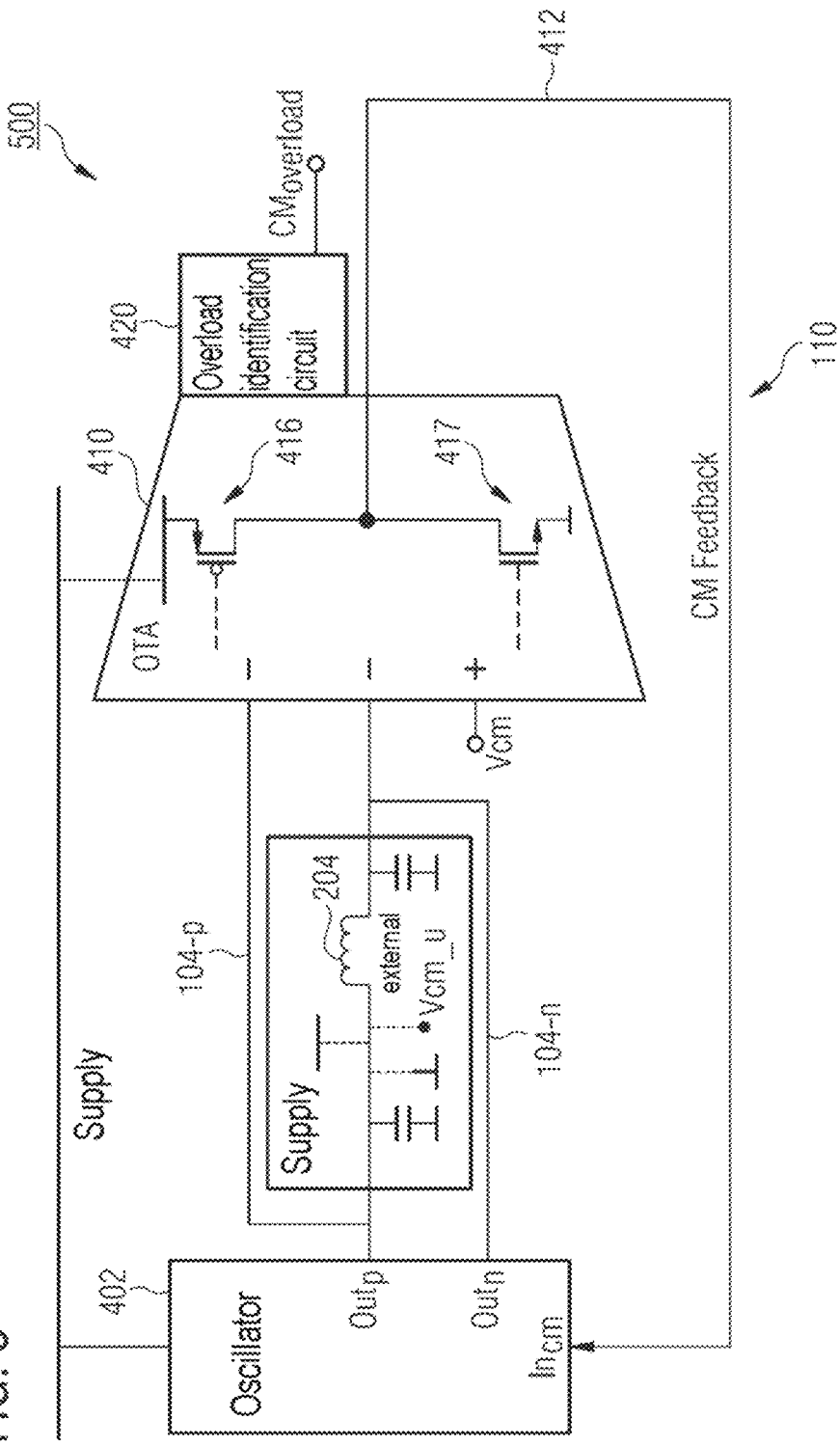
FIG. 5 shows open-circuit and short-circuit identification for oscillator and LC components (on PCB) using overload identification with an analog common-mode control loop in accordance with a further example implementation.

While FIG. 4 shows a control circuit 400 having a transconductance amplifier 410 having two feedback outputs for two control currents 412-*p*, 412-*n* for the signal cores 104-*p*, 104-*n*, FIG. 5 shows a further example implementation, in which the transconductance amplifier 410 has only one feedback output for only one control current 412, which is fed back to the oscillator circuit 402 for the purpose of controlling the oscillator circuit 402 as common-mode signal source of the differentially operated exciter resonant circuit 203. FIG. 5 schematically shows an output current source 414 of the transconductance amplifier 410, the output current source having PMOS transistors 416 and NMOS transistors 417 which are connected between a supply potential and ground and are coupled to one another. The control current 412 for the oscillator circuit 402 flows from a coupling node of the respective drain terminals.

Figure 6:
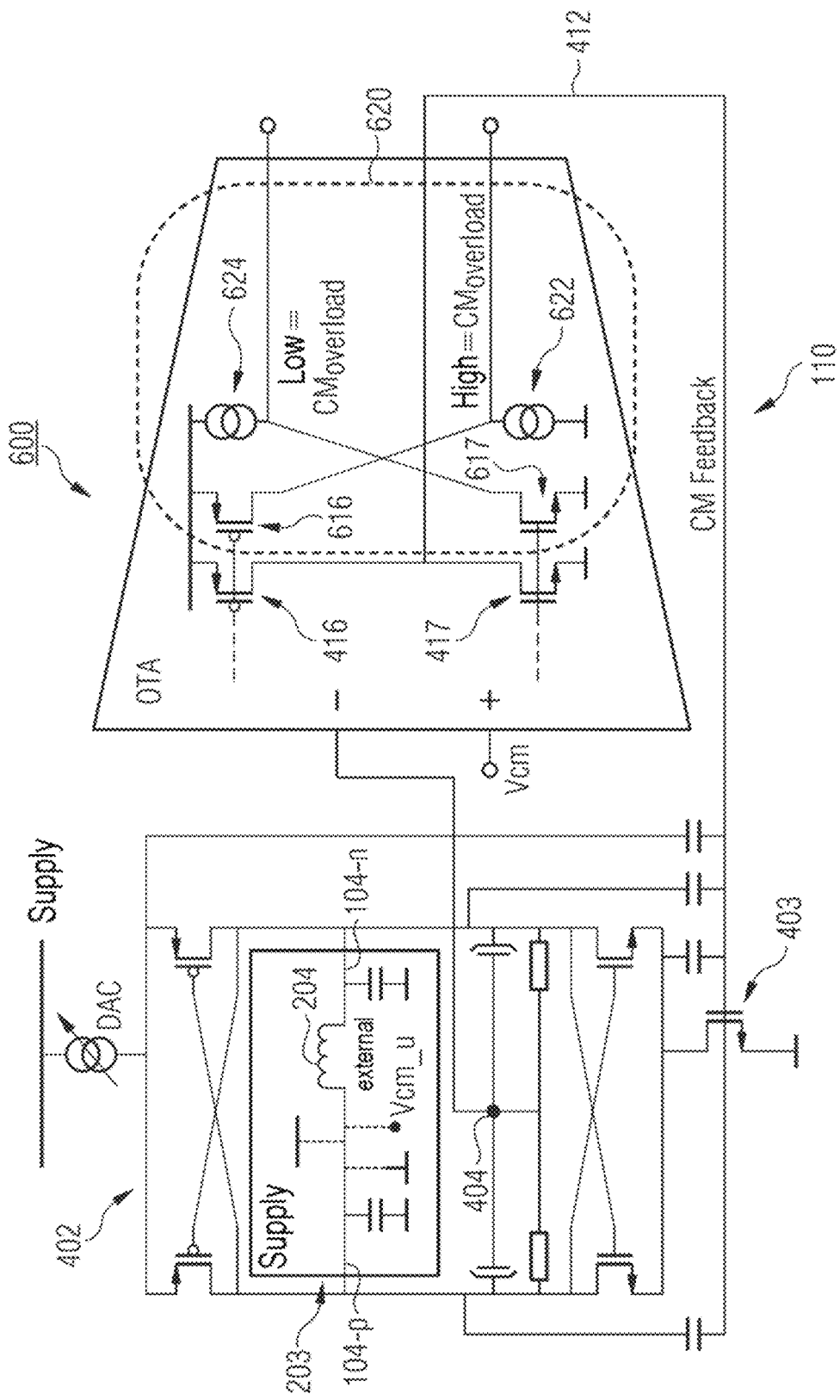
FIG. 6 shows open-circuit and short-circuit identification for oscillator and LC components (on PCB) using overload identification with an analog common-mode control loop using replica currents of the control loop for comparison with reference currents.

A further example implementation of a circuit 600 for detecting a line short circuit and/or a line interruption in a differentially operated line network is illustrated in FIG. 6.

The oscillator circuit 402 that can be situated as an integrated circuit in the ASICs 302-1 and respectively 302-2 is illustrated in greater detail in the implementation shown in FIG. 6. The oscillator circuit 402 has a control transistor 403 coupled to the feedback output of the transconductance amplifier 410. The oscillator circuit 402 furthermore has a circuit network having cross-coupled NMOS and PMOS transistors in order to generate AC current or AC voltage for the differentially operated exciter resonant circuit 203. A common-mode potential that is controllable via the control transistor 403 can be tapped off at a circuit node 404 between two capacitances connected to the drain terminals of the cross-coupled NMOS and PMOS transistors. The common-mode potential is fed as controlled variable to an inverting input of the transconductance amplifier 410 and is compared with the setpoint value $V_{CM}$.

In the example implementation shown in FIG. 6, the control circuit has a current comparison circuit 620 configured to compare the control current 412 provided via the feedback output of the transconductance amplifier 410 with at least one predefined threshold. current provided via at least one current source and to indicate a line short circuit and/or a line interruption in the differentially operated line network if the control current 412 exceeds the predefined threshold value in terms of absolute value. In the example implementation illustrated, the current comparison circuit 620 has a PMOS replica transistor 616, the gate terminal of which is coupled to the gate terminal of the PMOS output transistor 416. The source terminal of the PMOS replica transistor 616, like the source terminal of the PMOS output transistor 416, is coupled to a supply potential. A first reference current source 622 is coupled between ground and drain terminal of the PMOS replica transistor 616. In the example implementation illustrated, the current comparison circuit 620 also has an NMOS replica transistor 617, the gate terminal of which is coupled to the gate terminal of the NMOS output transistor 417. The source terminal of the NMOS replica transistor 617, like the source terminal of the NMOS output transistor 417, is coupled to ground. A second reference current source 624 is coupled between the supply potential and the drain terminal of the NMOS replica transistor 617. Comparison threshold values for the control current 412 can be set via the reference current sources 622, 624.

In the case of line short circuits and/or line interruptions in the differentially operated exciter resonant circuit 203, in the example implementation shown in FIG. 6, the drain terminal of the NMOS replica transistor 617 can be pulled to "low" on account of a greater control current 412 in terms of absolute value. Equally, in the case of line short circuits and/or line interruptions, the drain terminal of the PMOS replica transistor 616 can be pulled to "high" on account of a greater control current 412 in terms of absolute value. It should be mentioned here that control currents 412 can flow out of and into the transconductance amplifier 410, that is to say can have different signs.

Figure 7:
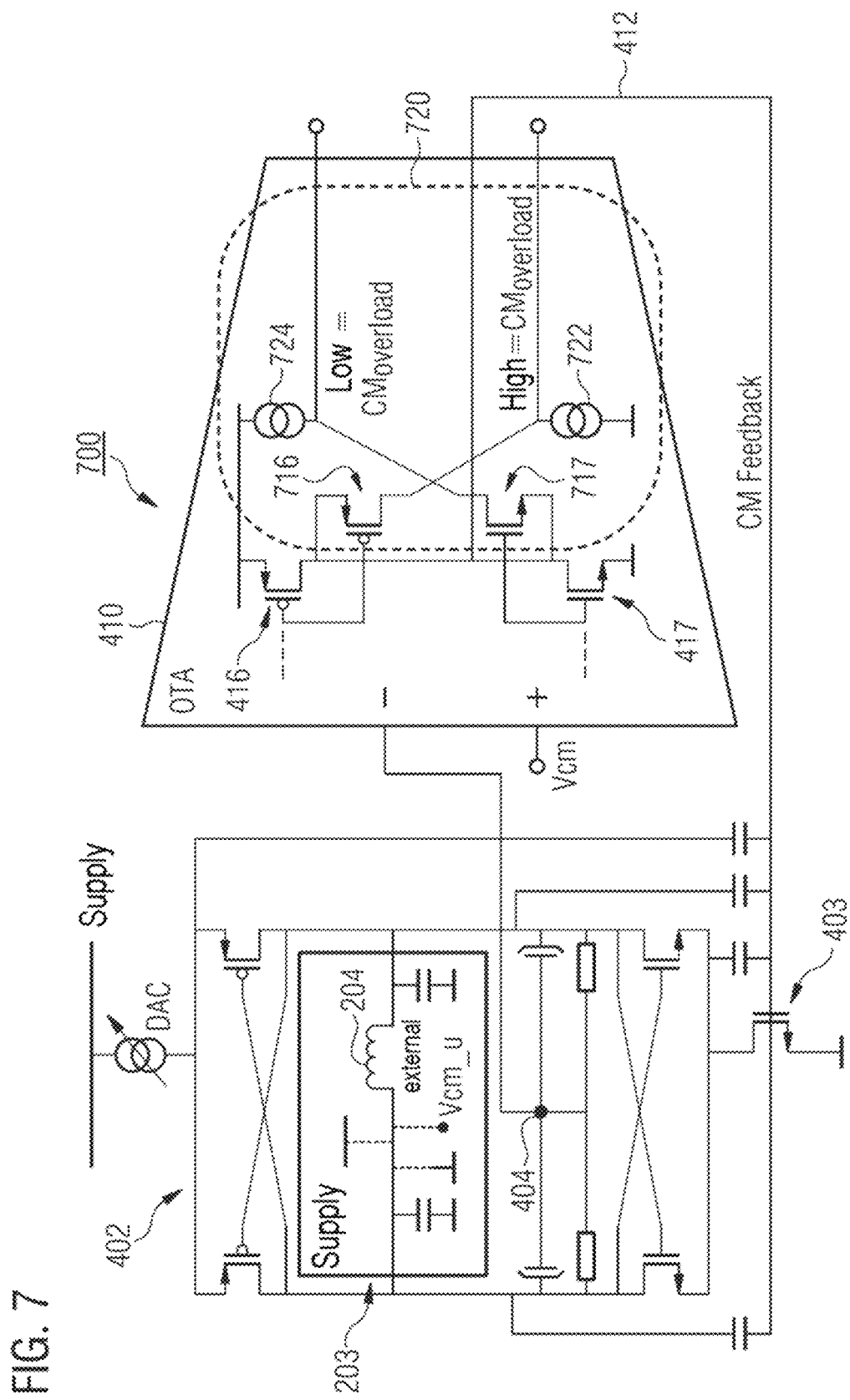
FIG. 7 shows open-circuit and short-circuit identification for oscillator and LC components (on PCB) using overload identification with an analog common-mode control loop using transistors for identifying non-saturation.

FIG. 7 shows an implementation in which the transconductance amplifier 410 has a detection circuit 720 configured to ascertain whether the output transistors 416, 417 of the transconductance amplifier 410 for providing the control current 412 via the feedback output leave their saturation region, and to indicate a line short circuit and/or a line interruption in the differentially operated line network 203 if the saturation region is left. In the example implementation illustrated, the detection circuit 720 has a PMOS transistor 716, the gate terminal of which is coupled to the gate terminal of the PMOS output transistor 416. The source terminal of the PMOS transistor 716 is coupled to the drain terminal of the PMOS output transistor 416. A first current source 722 is coupled between ground and drain terminal of the PMOS transistor 616. In the example implementation illustrated, the detection circuit 720 also has an NMOS transistor 717, the gate terminal of which is coupled to the gate terminal of the NMOS output transistor 417. The source terminal of the NMOS transistor 717 is coupled to the drain terminal of the NMOS output transistor 417. A second current source 724 is coupled between the supply potential and the drain terminal of the NMOS transistor 717. Potentials of the drain terminals of the saturation identification transistors 716, 717 indicate the leaving of the saturation regions of the output transistors 416, 417. If the drain terminal of the NMOS transistor 717 is "low" and the drain terminal of the PMOS transistor 716 is "high", for example, the output transistors 416, 417 have left their saturation regions, which allows a line short circuit and/or a line interruption in the differentially operated exciter resonant circuit 203 to be deduced.

Figure 8:
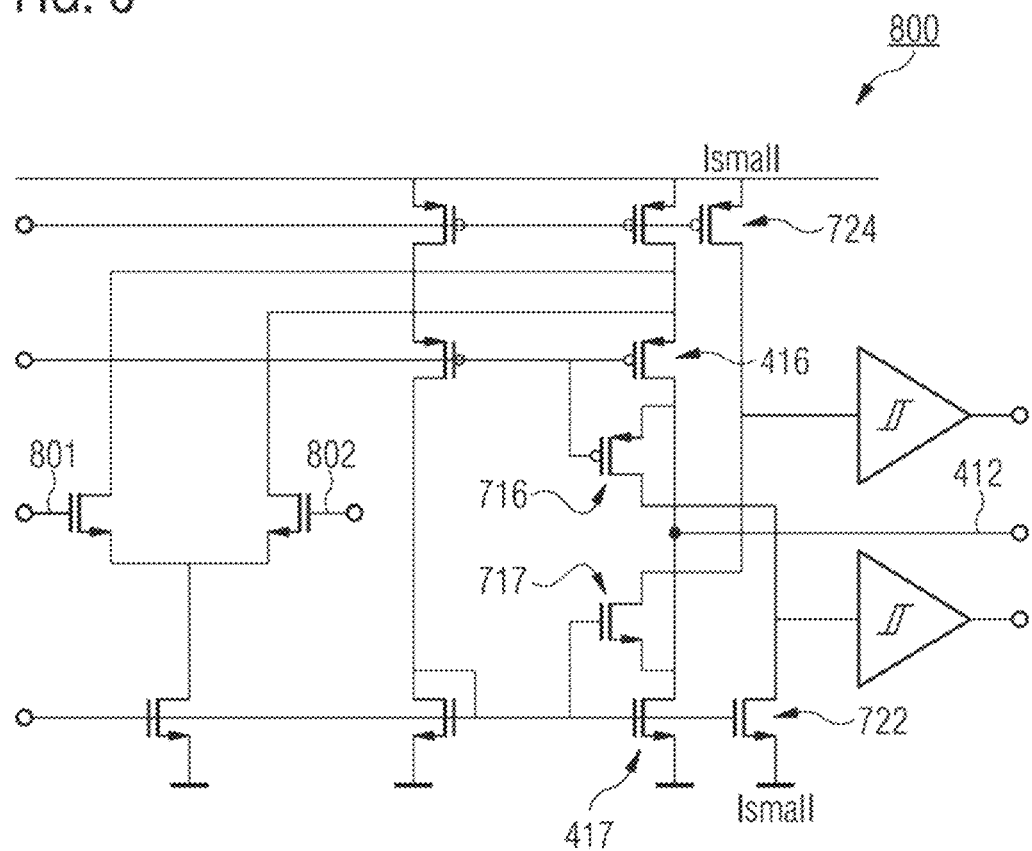
FIG. 8 shows a more detailed circuit illustration of the concept from FIG. 7.

The possible circuit illustrated in FIG. 8 is a more detailed illustration of the transconductance amplifier 410 from FIG. 7 with the output transistors 416, 417 and the saturation identification transistors 716, 717. The transconductance amplifier 410 here is implemented in a so-called folded-cascade configuration with input terminals 801, 802 (folded-cascade OTA).

Figure 9:
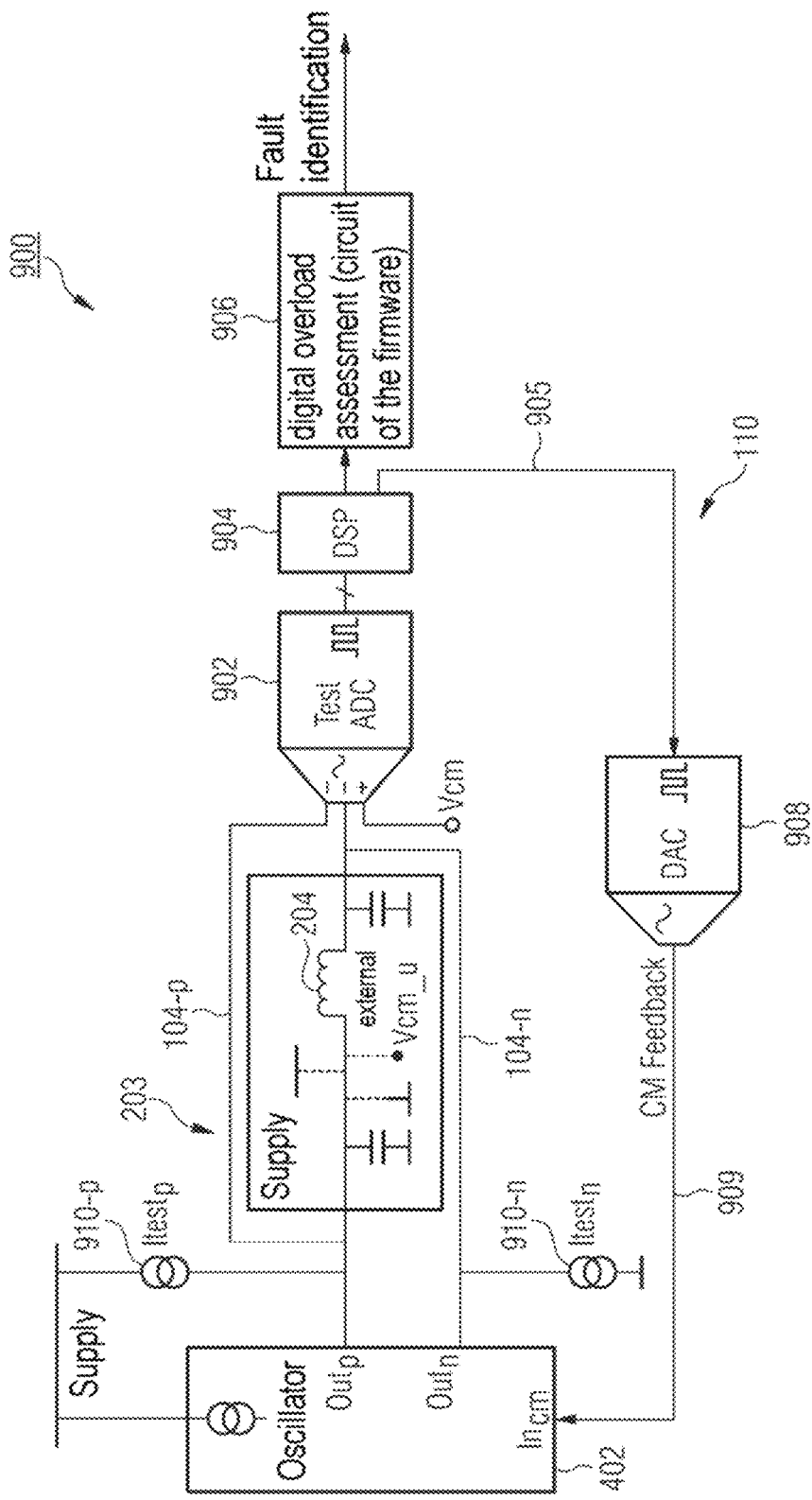
FIG. 9 shows open-circuit and short-circuit identification using overload identification with a digital common-mode control loop.

FIG. 9 shows a circuit arrangement 900, in which the common-mode signal control circuit is configured as a digital control circuit. The analog signals of the signal cores 104-n, 104-n and an analog common-mode signal setpoint variable $V_{CM}$ are fed to an ADC 902. The ADC 902 is configured to convert the corresponding analog input signals into digital signals with a predetermined resolution. A digital signal processing circuit 904 is coupled to an output of the ADC 902 and is configured to determine an actual value of the controlled common-mode signal from the signals of the differentially operated exciter resonant circuit 203 that have been subjected to analog-to-digital conversion, and to compare the actual value with the common-mode signal setpoint variable and, in response thereto, to determine a digital control signal 905. If the digital control signal 905 and/or the actual value of the controlled common-mode signal exceed(s) a predefined threshold value in terms of absolute value, this can be detected in a detector 906 and a fault message (line short circuit/line interruption) can thereupon be output. The digital control signal 905 is subjected to digital-to-analog conversion via a feedback path having a DAC 908 and the signal is fed as an analog control signal 909 to the oscillator circuit 402 in order, on the basis thereof, to generate the common-mode signal generated by the oscillator circuit 402 for the signal cores 104-p, 104-n.

In the example implementation shown in FIG. 9, DC current sources 910-p and 910-n are furthermore provided. The DC current source 910-p is configured to inject a predefined DC current into the positive signal core 104-p. The DC current source 910-n is provided in order to inject a compensation current complementary thereto (with inverted signs) into the negative signal core 104-n. It goes without saying that such additional DC current sources for injecting complementary DC currents into the differential signal cores 104-p, 104-n can also be used in the example implementations discussed previously. The use of such DC current sources 910 can make the fault identification by the herein described analog and respectively digital control circuits even more reliable and/or more rapid.

It should be noted that the DC current sources 910-p and 910-n could also be replaced by AC current sources. The injected AC currents can have a specific frequency and phase or be generated pseudo-randomly. It can be advantageous if these AC signals lie outside a useful signal frequency range, in order to reduce coupling effects.

Figure 10:
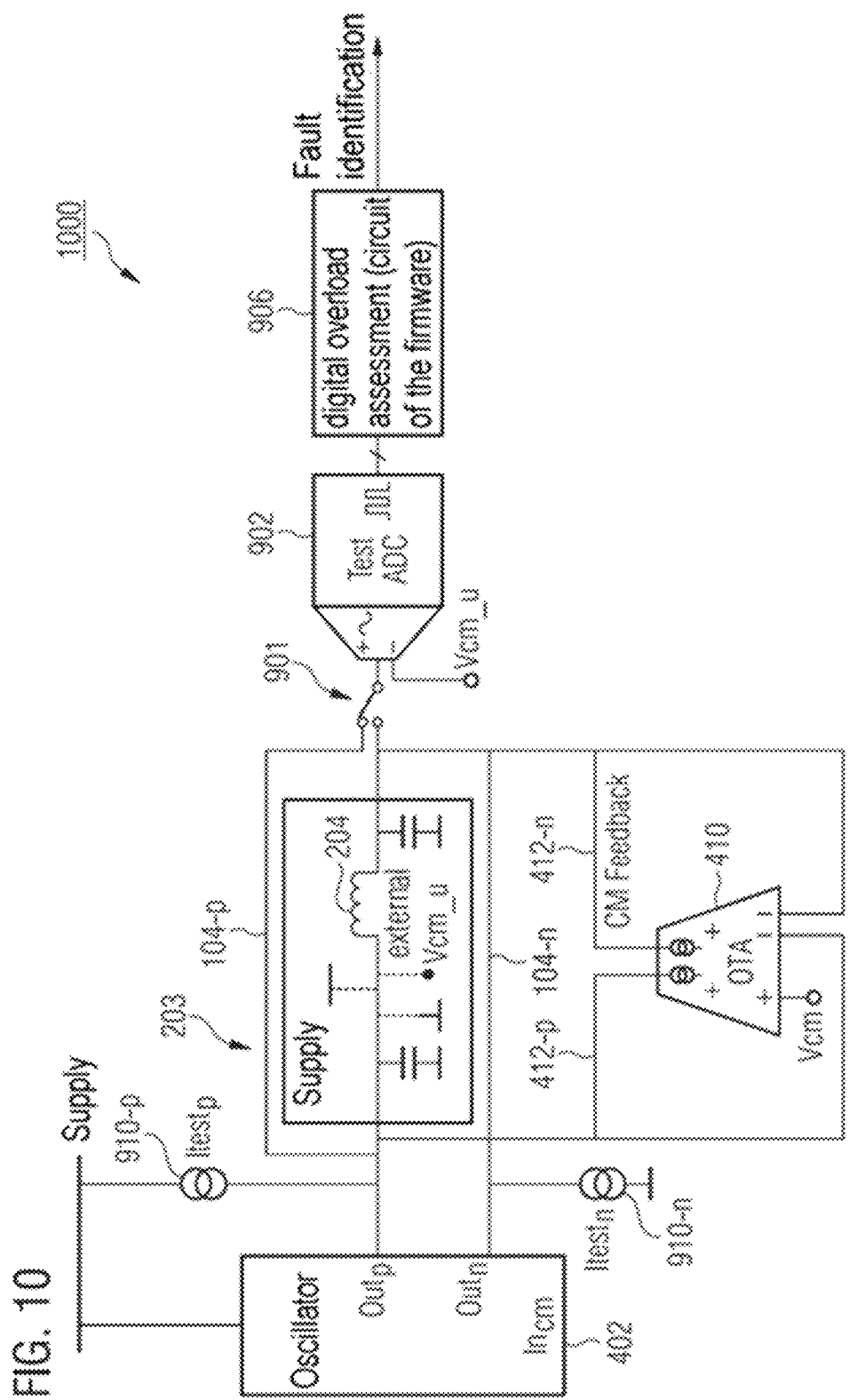
FIG. 10 shows identification of interruptions and short circuits of oscillator and LC components (on PCB) by way of overloading of an ADC for common-mode measurements.

The circuit arrangement 1000 shown in FIG. 10 is constructed in a similar manner to the example implementation in FIG. 4. The signal cores 104-p, 104-n are respectively passed to inverting inputs of a transconductance amplifier 410, which feeds analog control signals 412-p, 412-p back to the respective signal cores 104-p, 104-n. In some implementations, as shown in FIG. 10, the identification of line interruptions and/or line short circuits is not implemented in an analog manner in the transconductance amplifier 410, but rather digitally. For this purpose, in the example implementation in FIG. 10, the signal cores 104-p, 104-n are passed by multiplexing together with a common-mode signal setpoint variable to inputs of an ADC 902. A digital signal processing circuit 906 arranged on the output side of the ADC 902 is configured to determine an actual value of the common-mode signal controlled in an analog manner from the signals of the differentially operated exciter resonant circuit 203 that are subjected to analog-to-digital conversion, and to compare the actual value with the common-mode signal setpoint variable in order to ascertain line interruptions and/or line short circuits. If the actual value of the controlled common-mode signal exceeds a predefined threshold value in terms of absolute value, for example, this can be detected in the detector 906 and a fault message (line short circuit/line interruption) can thereupon be output.

While predominantly example implementations concerning the detection of line interruptions and/or line short circuits on the exciter side of an inductive angle sensor have been discussed with reference to the previous figures, example implementations concerning the sensor coil arrangement 205 will be discussed with reference to the subsequent figures.

Figure 11:
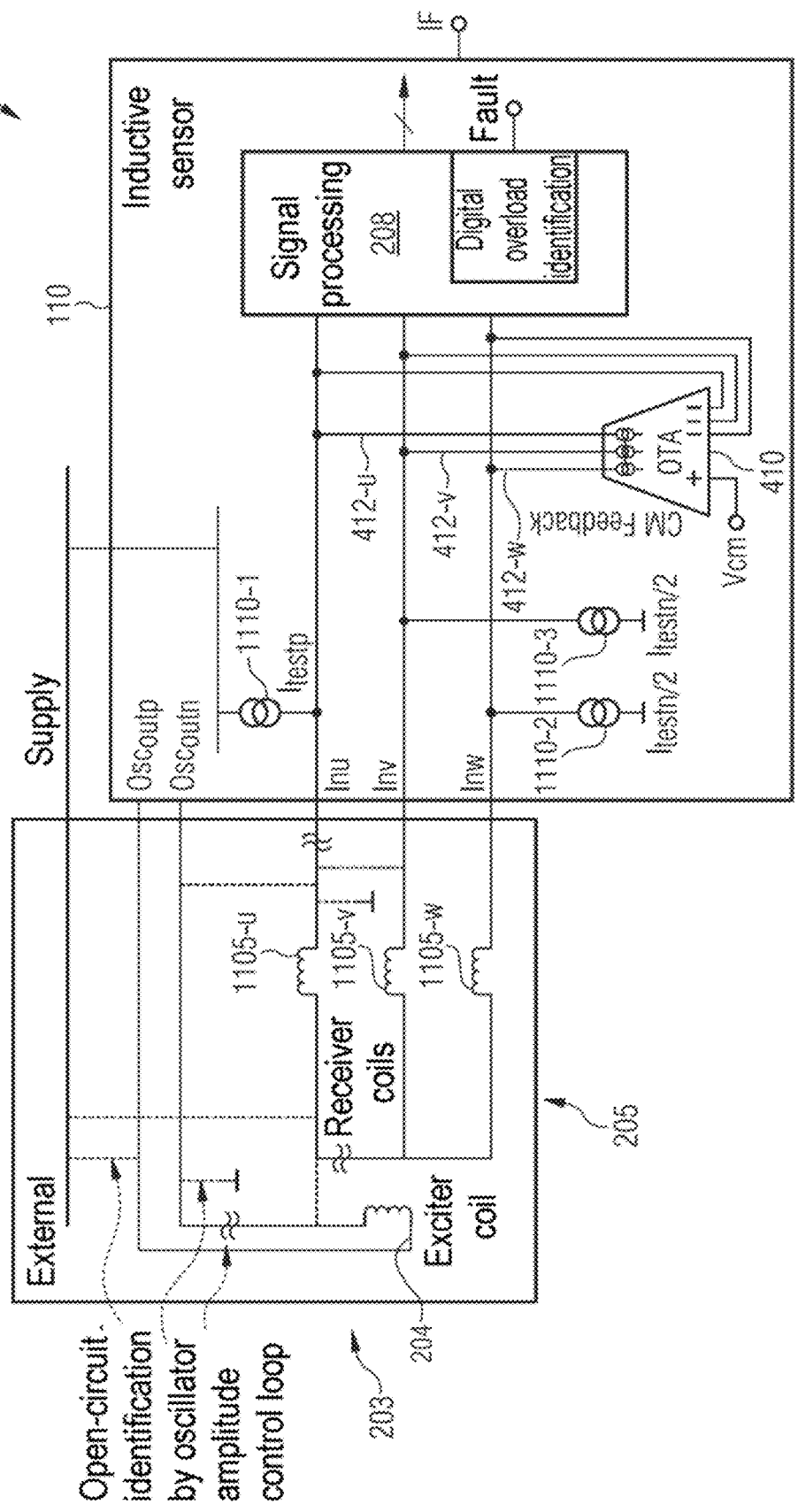
FIG. 11 shows open-circuit and short-circuit identification at the inputs of a three-phase inductive sensor using overload identification during the digital signal processing.

In this respect, FIG. 11 schematically depicts a circuit arrangement 1100 relating to an inductive angle sensor. Besides the exciter coil indicated by reference sign 204, primarily the sensor coil arrangement 205 with the evaluation circuit 208 already mentioned above is illustrated in FIG. 11. FIG. 11 shows merely by way of example a 3-phase sensor coil arrangement 205. The sensor coil arrangement 205 here has three sensor coils 1105-u, 1105-v and 1105-w operated in common-mode fashion. The sensor coils 1105-u, 1105-v, 1105-w can be arranged offset by 90° in each case in relation to the rotor 202. From the phase-shifted induction signals resulting therefrom, the evaluation circuit 208 can determine the rotation angle φ. Furthermore, the evaluation circuit 208 can be configured, based on controlled common-mode signals of the sensor coils 1105-u, 1105-v, 1105-w operated in common-mode fashion and arranged in a phase-offset manner, to indicate a line short circuit and/or a line interruption in the sensor coil arrangement 205 or in the exciter resonant circuit 203 if at least one of the controlled common-mode signals leaves a predefined tolerance range.

In a manner similar to that described in some previous example implementations, an analog control circuit for controlling the common-mode signals comprises a transconductance amplifier 410. The individual signal lines of the sensor coils 1105-u, 1105-v, 1105-w are respectively coupled to inverting inputs of the transconductance amplifier 410. An analog common-mode signal setpoint value (e.g. common-mode voltage) $V_{CM}$ is fed to the noninverting input of the transconductance amplifier 410. For each of the signal lines of the sensor coils 1105-u, 1105-v, 1105-w, the transconductance amplifier 410 provides a respective control current 412-u, 412-v, 412-w on the output side, the control current being fed to the respective signal lines of the sensor coils 1105-u, 1105-v, 1105-w.

In order to detect line short circuits and/or line interruptions more efficiently, here too a DC current source is assigned to each of the sensor coils 1105-u, 1105-v, 1105-w operated in common-mode fashion. For example, a predefined DC current is fed to the signal line of the sensor coil 1105-u by way of a DC current source 1110-1. Respectively, compensation current sources 1110-2, 1110-3 are correspondingly provided for the signal lines of the other two sensor coils 1105-$v$ and 1105-$w$ and each compensate half of the predefined DC current fed by way of the DC current source 1110-1. Consequently, the DC currents fed, which can also be referred to here as common-mode signals, do not affect the differential signal routing in the majority of the differentially operated sensor coils 1105-$u$, 1105-$v$ and 1105-$w$. Instead of the two compensation current sources 1110-2, 1110-3, just a single compensation current source could also be used, which is then switched back and forth alternately between the two sensor coils 1105-$v$ and 1105-$w$, for example.

Figure 12:
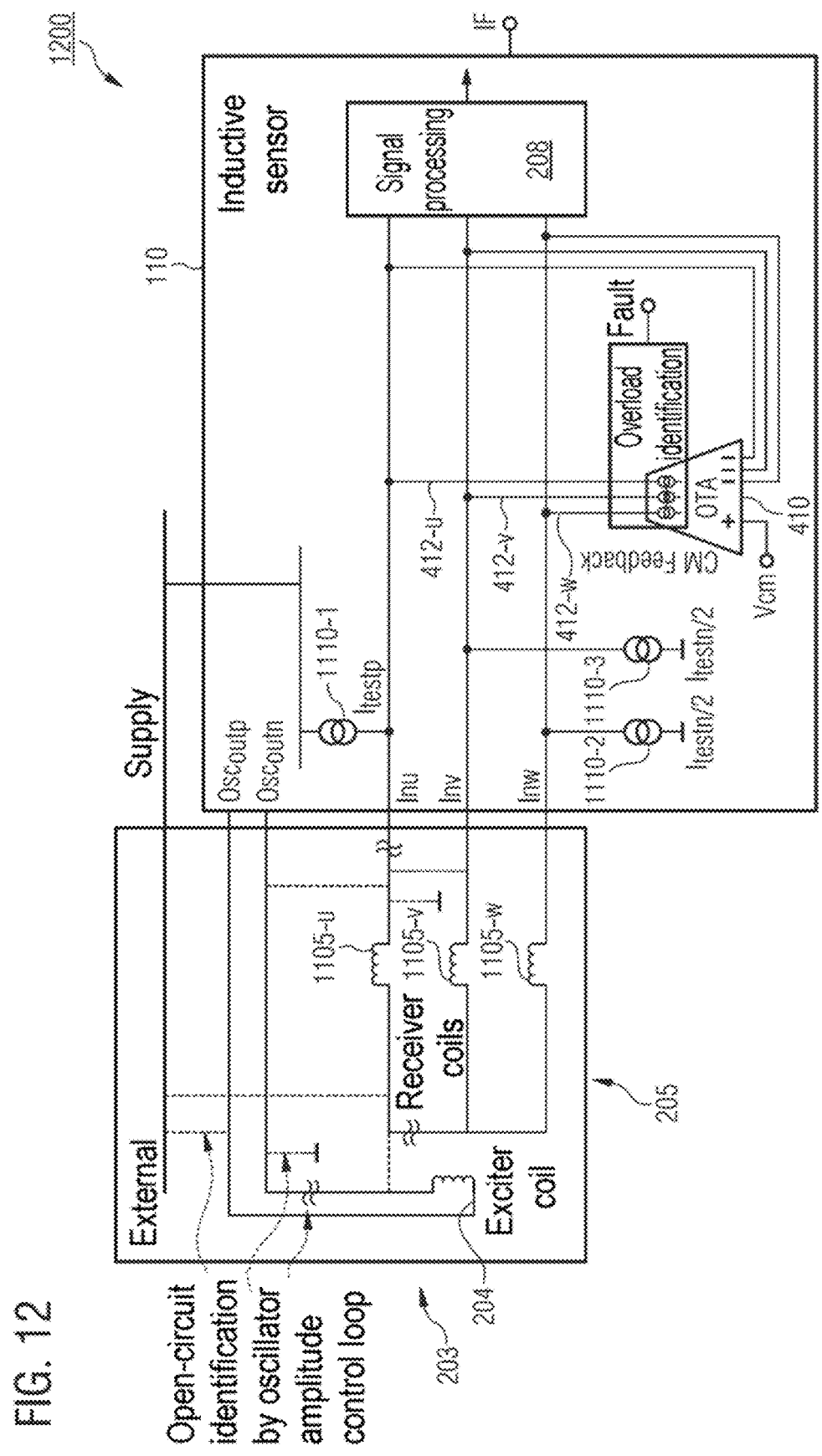
FIG. 12 shows open-circuit and short-circuit identification at the inputs of a three-phase inductive sensor using overload identification in an analog common-mode control loop.

While the circuit arrangement 1100 in FIG. 11 can identify line short circuits and/or interruptions based on digital signal processing in the evaluation circuit 208, FIG. 12 shows an alternative implementation, in which the identification of short circuits and/or interruptions can take place in an analog manner in the transconductance amplifier 410. In this implementation, the transconductance amplifier 410 can be embodied with additional reference current sources, as has been described with reference to FIG. 6 or FIG. 7, for example.

Figure 13:
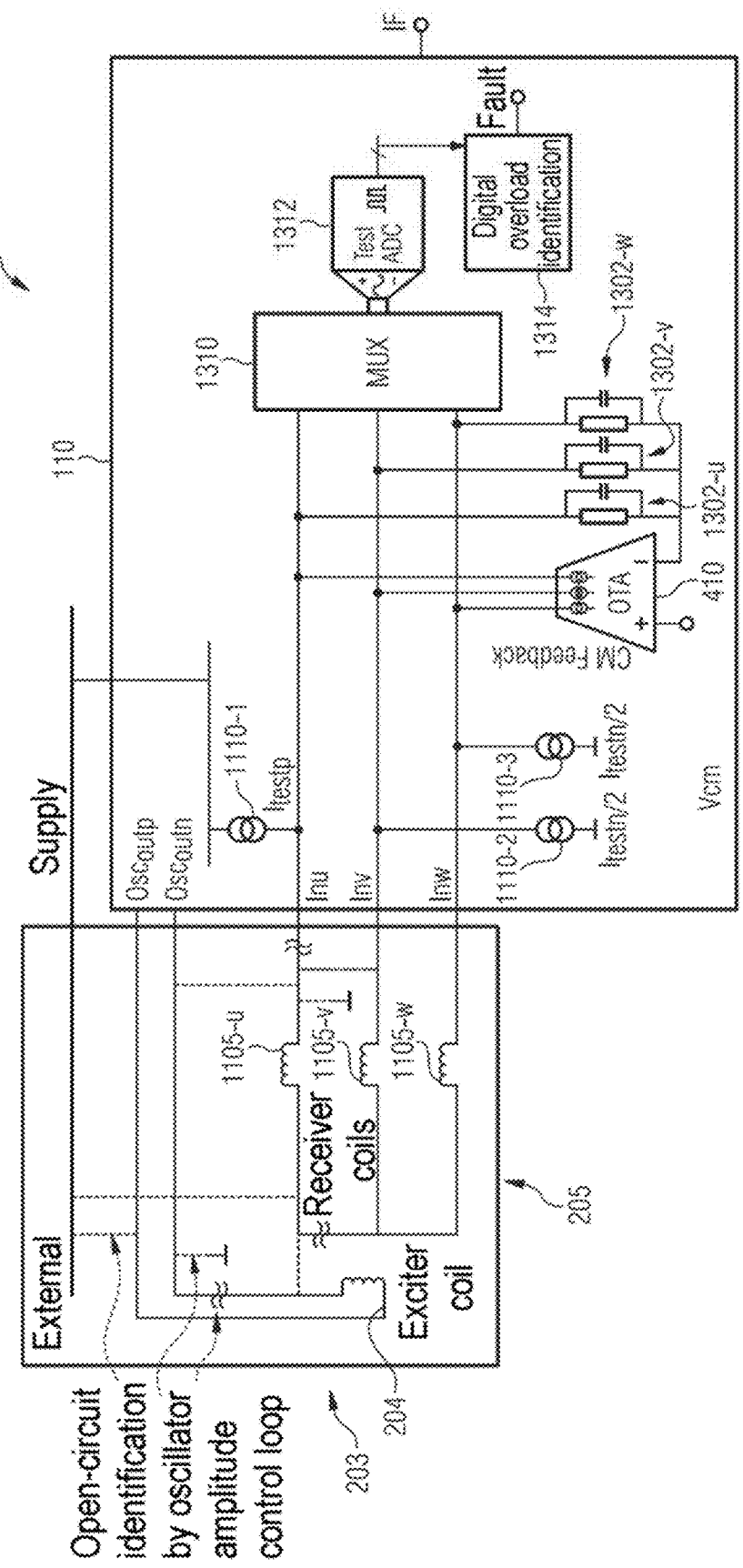
FIG. 13 shows open-circuit and short-circuit identification at the inputs of a three-phase inductive sensor using overload identification during the digital signal processing with an ADC.

Instead of realizing the averaging of the respective sensor coil signals using the transconductance amplifier 410, as shown in FIGS. 11 and 12, averaging of the sensor coil signals can also take place outside the transconductance amplifier 410. For this purpose, the example implementation in FIG. 13 shows an RC structure 1302-$u$, 1302-$v$, 1302-$w$ for averaging for each of the sensor coil signals. The RC structures 1302-$u$, 1302-$v$, 1302-$w$ act as low-pass filters and realize the averaging in each case outside the transconductance amplifier 410. The outputs of each low-pass filter 1302-$u$, 1302-$v$, 1302-$w$ are brought together to a common noninverting transconductance amplifier input. FIG. 13 furthermore shows how, in the evaluation circuit 208, line short circuits and/or line interruptions could be identified in the digital domain. With the aid of a multiplexer 1310, the signal lines of the sensor coils 1105-$u$, 1105-$v$, 1105-$w$ are switched alternately to inputs of an ADC 1312. The digital sensor coil signals provided on the output side of the ADC 1312 are compared either with one another or vis-à-vis a common-mode signal setpoint value by a digital signal processing circuit 1314 in order to ascertain whether line interruptions or line short circuits are present in the differentially operated line network (on the exciter side and/or on the sensor side).

Figure 14:
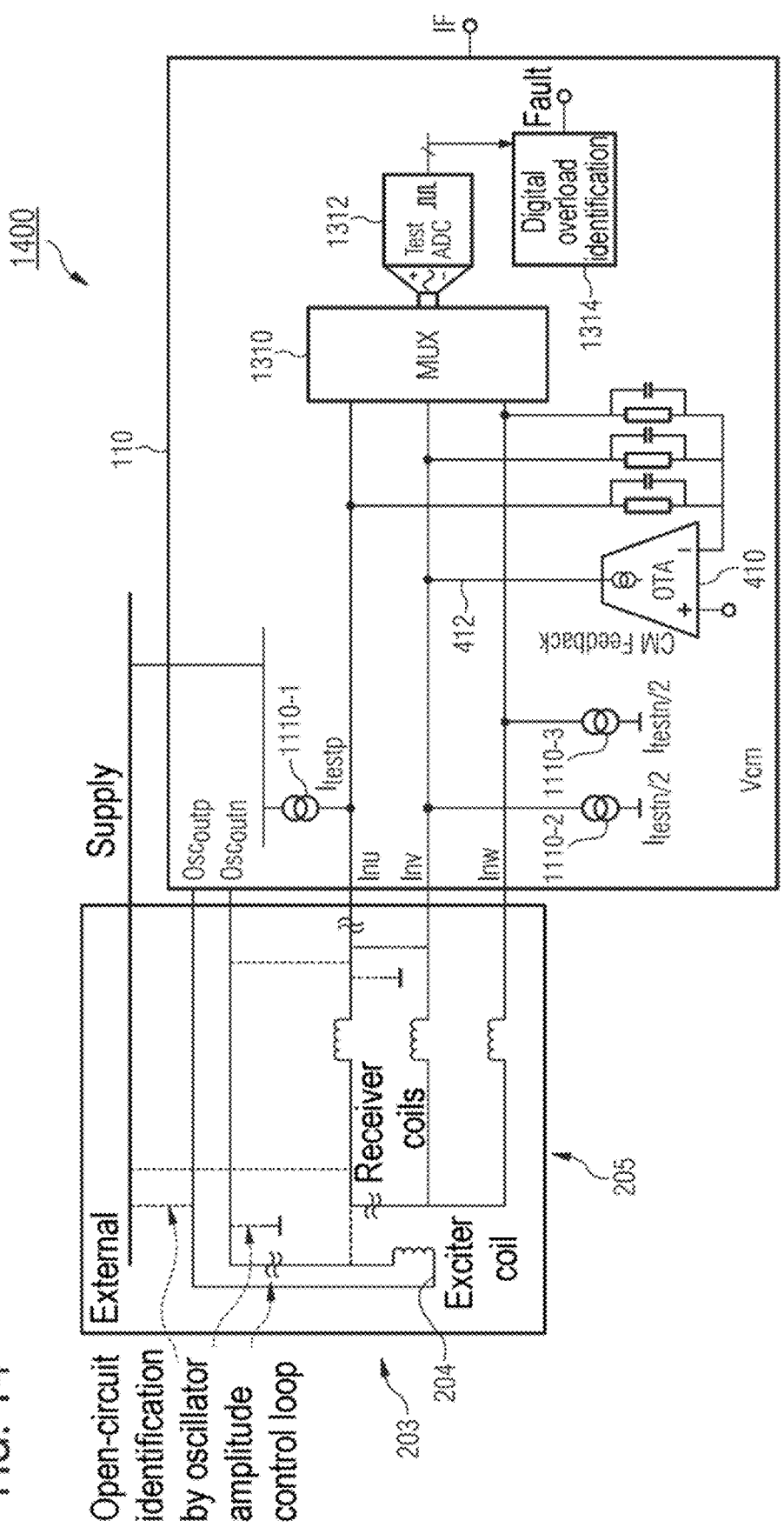
FIG. 14 shows open-circuit and short-circuit identification at the inputs of a three-phase inductive sensor using overload identification in an analog common-mode control loop with an ADC (1 output current source of the OTA)

While in the example implementation in FIG. 13 the transconductance amplifier 410 provides a respective control current for each of the signal lines of the sensor coils 1105-$u$, 1105-$v$, 1105-$w$, only one control current output is provided at the transconductance amplifier 410 in the example implementation shown in FIG. 14. Here a control current 412 is provided only for the central sensor coil 1105-$v$. It goes without saying that the control current 412 could also be fed to each of the other two sensor coils 1105-$u$, 1105-$w$.

Figure 15:
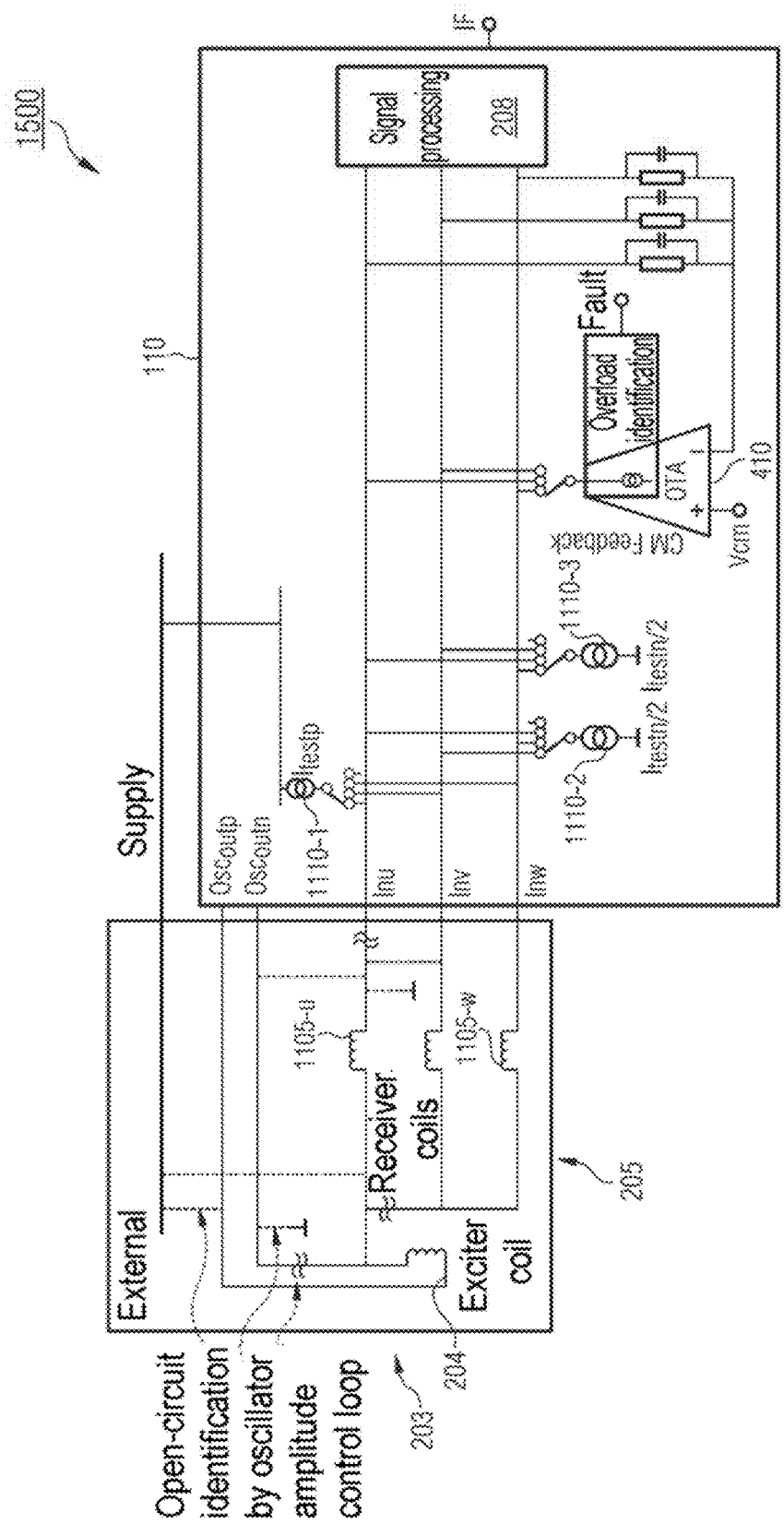
FIG. 15 shows open-circuit and short-circuit identification at the inputs of a three-phase inductive sensor using analog overload identification in an analog common-mode control loop.

FIG. 15 shows a further implementation, in which each of the DC current sources 1110-1, 1110-2, 1110-3 for the injected DC current and the compensation currents thereof is configured as switchable in order to be able to be switched alternately to different signal lines of the sensor coils 1105-$u$, 1105-$v$, 1105-$w$. In a first switching phase, the first DC current source 1110-1 can be switched for example to the signal line assigned to the sensor coil 1105-$u$. In the first switching phase, the DC current source 1110-2 can be switched to the signal line assigned to the sensor coil 1105-$v$. In the first switching phase, the DC current source 1110-3 can be switched to the signal line assigned to the sensor coil 1105-$w$. In a second switching phase, the first DC current source 1110-1 can then be switched to the signal line assigned to the sensor coil 1105-$w$. In the second switching phase, the second DC current source 1110-2 can be switched to the signal line assigned to the third sensor coil 1105-$w$. In the second switching phase, the third DC current source 1110-3 can be switched to the signal line assigned to the first sensor coil 1105-$u$. In a third switching phase, the first DC current source 1110-1 can be switched to the signal line assigned to the third sensor coil 1105-$w$. In the third switching phase, the second DC current source 1110-2 can be switched to the signal line assigned to the first sensor coil 1105-$u$. In the third switching phase, the third DC current source 1110-3 can be switched to the signal line assigned to the second sensor coil 1105-$v$. Other configurations are likewise conceivable, of course.

As can be discerned from FIG. 15, in this example implementation, the control output of the transconductance amplifier 410 can also be switched alternately to the individual signal lines. In this regard, for example, in the first switching phase, the control output can be coupled to the signal line of the third sensor coil 1105-$w$. In the second switching phase, the control output of the transconductance amplifier 410 can be coupled to the signal line of the first sensor coil 1105-$u$. In the third switching phase, the control output of the transconductance amplifier 410 can be coupled to the signal line of the second sensor coil 1105-$v$, for example. Other configurations are likewise conceivable, of course. Different fault sources can be identified in a more differentiated manner using this switchable arrangement of the injection currents or the control currents.

Figure 16:
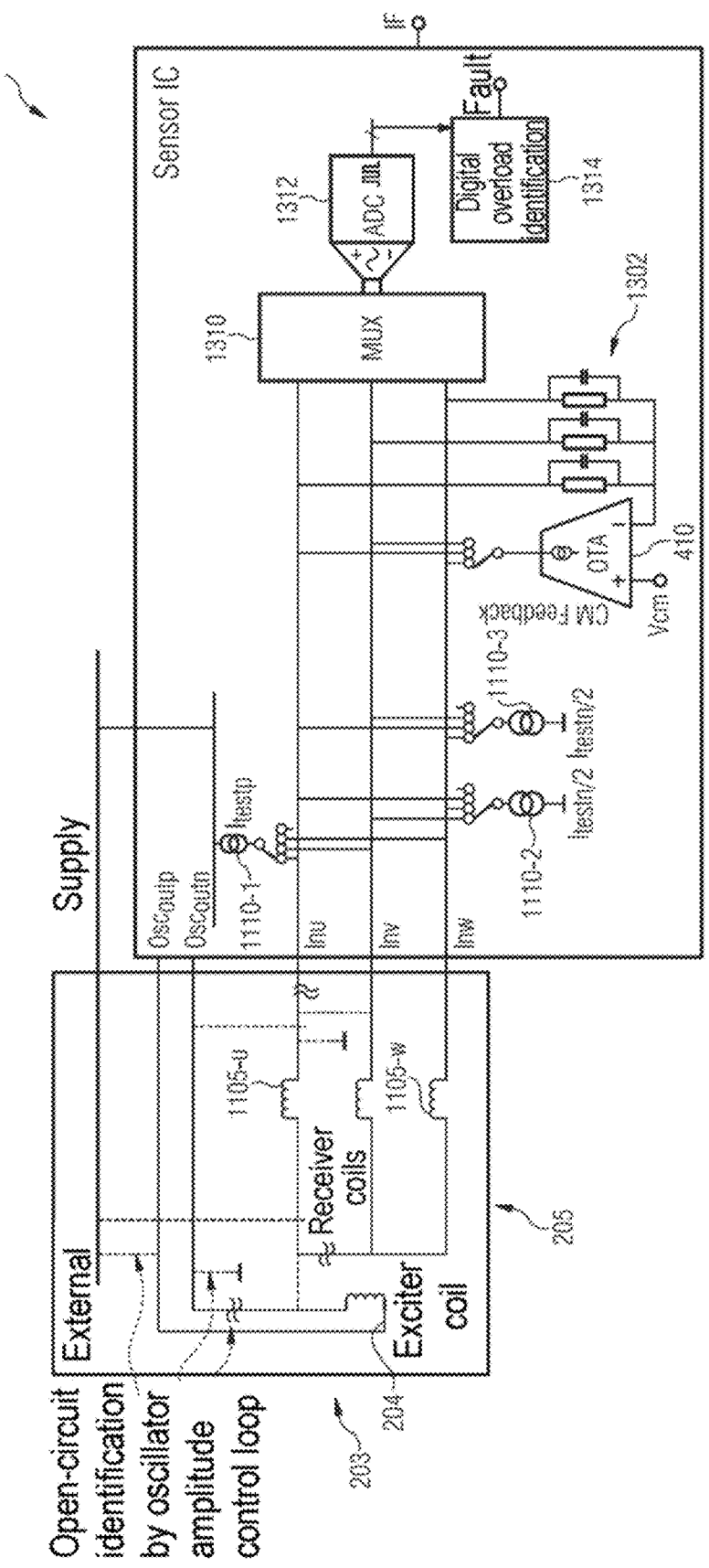
FIG. 16 shows identification of interruption and short circuits at the inputs of a three-phase inductive sensor using digital overload identification that is caused by an analog common-mode control loop.

While FIG. 15 shows an implementation in which the fault identification is implemented in an analog manner in the transconductance amplifier, FIG. 16 shows an example implementation with switched injection currents or control currents, in which the fault identification is implemented digitally, for example, in the evaluation circuit 208, as has already been described with reference to FIG. 13.

Figure 17:
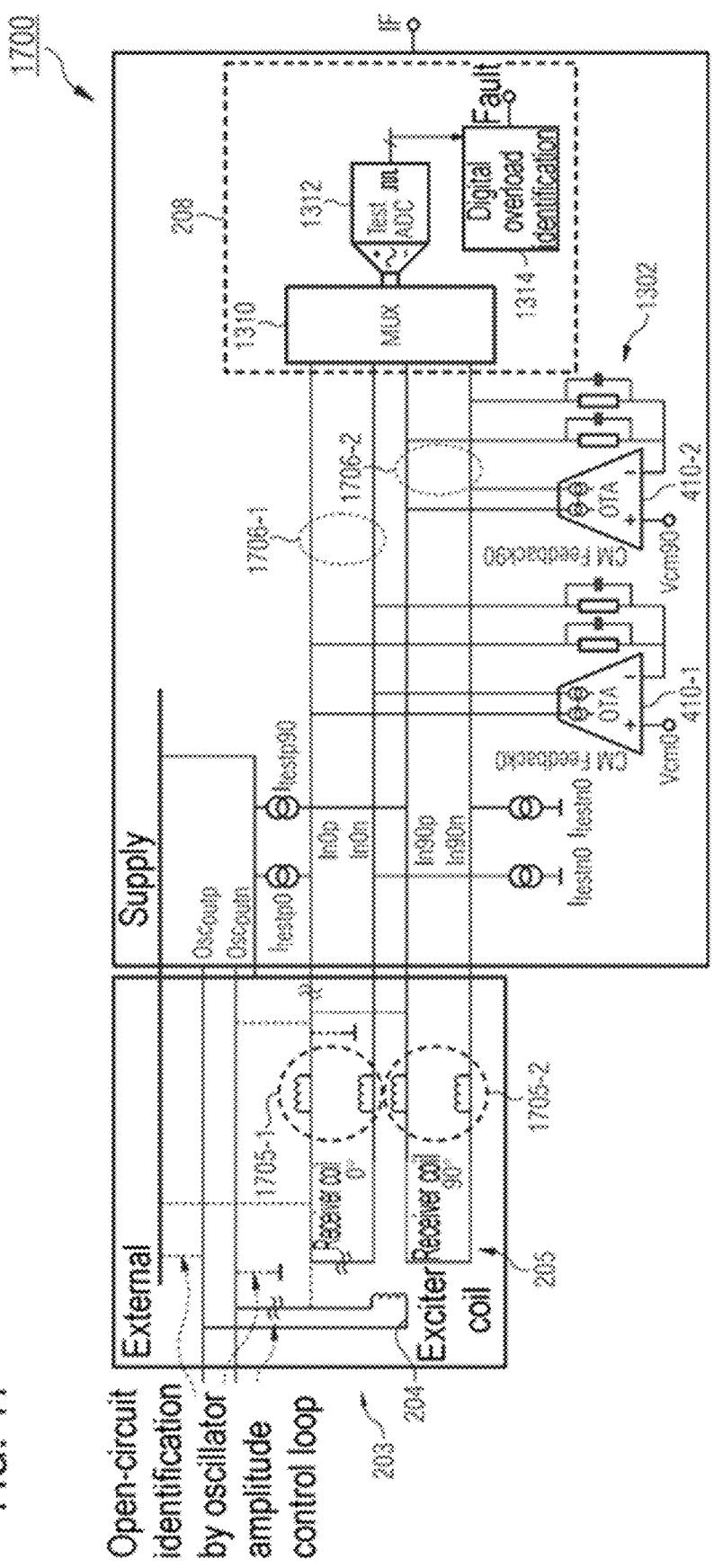
FIG. 17 shows open-circuit and short-circuit identification at the inputs of a two-phase inductive sensor using overload identification in an analog common-mode control loop with an ADC.

FIG. 17 shows one example implementation of a circuit arrangement 1700 for an inductive angle sensor, in which the sensor coil arrangement 205 comprises a 2-phase system in contrast to the 3-phase systems described above. In this example implementation, each of the two sensor coils 1705-1, 1705-2 has differential signal routing. That is to say that each of the two sensor coils 1705-1, 1705-2 is coupled to the evaluation circuit 208 by a differential line pair 1706-1, 1706-2. Each of the two differentially operated sensor coils 1705-1, 1705-2 can then be operated with a dedicated common-mode potential, for example. While for the first differentially operated sensor coil 1705-1 a first common-mode potential can be 0.8 V, for example, a second common-mode potential for the second differentially operated sensor coil 1705-2 can be 1.2 V, for example. The analog control circuit shown in FIG. 17 then provides a dedicated analog control loop with respective transconductance amplifiers 410-1 and 410-2 for each of the two different common-mode potentials.

Figure 18:
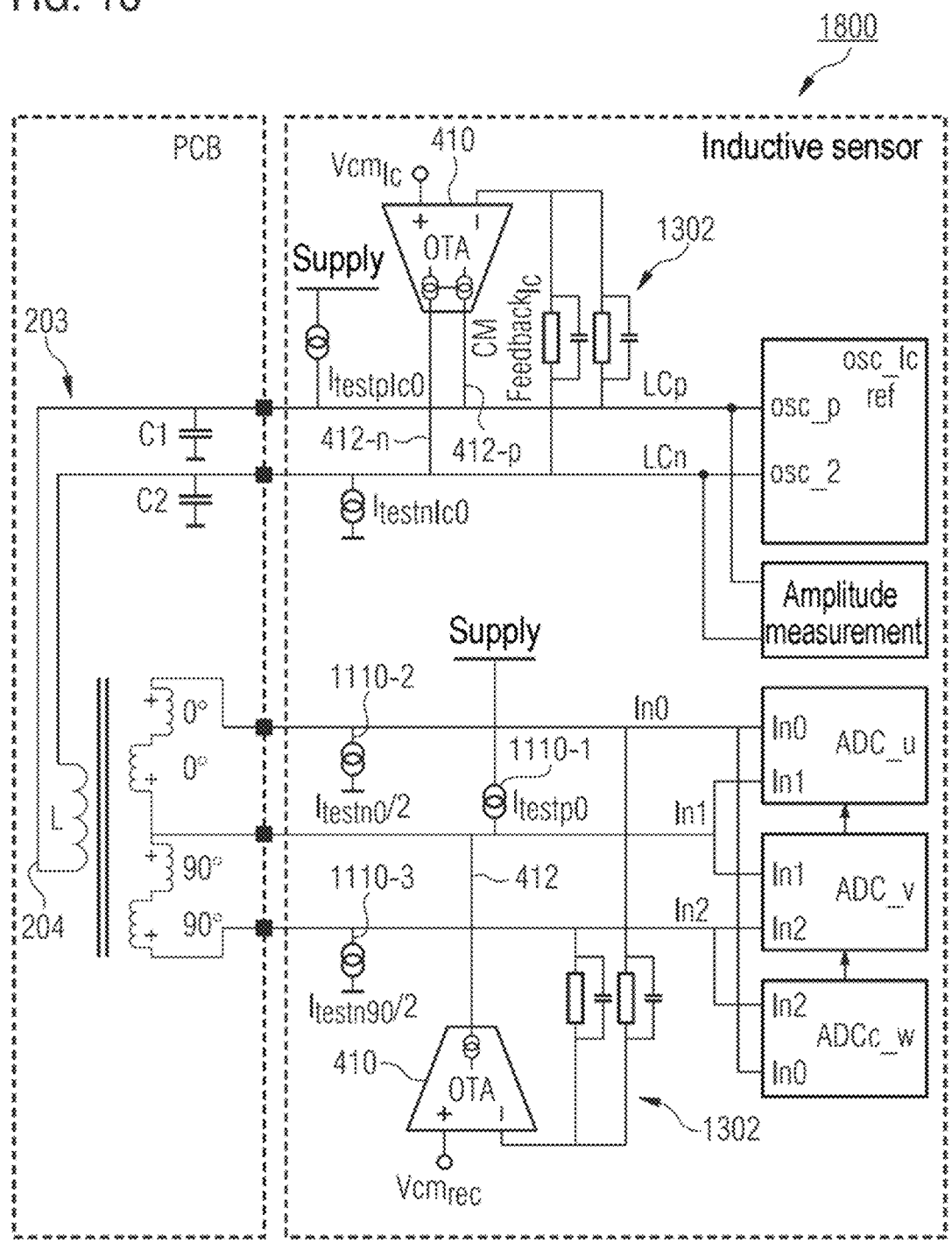
FIG. 18 shows open-circuit and short-circuit identification at the inputs of a 2-phase inductive sensor having 3 differential inputs using overload identification in an analog common-mode control loop.
Figure 19:
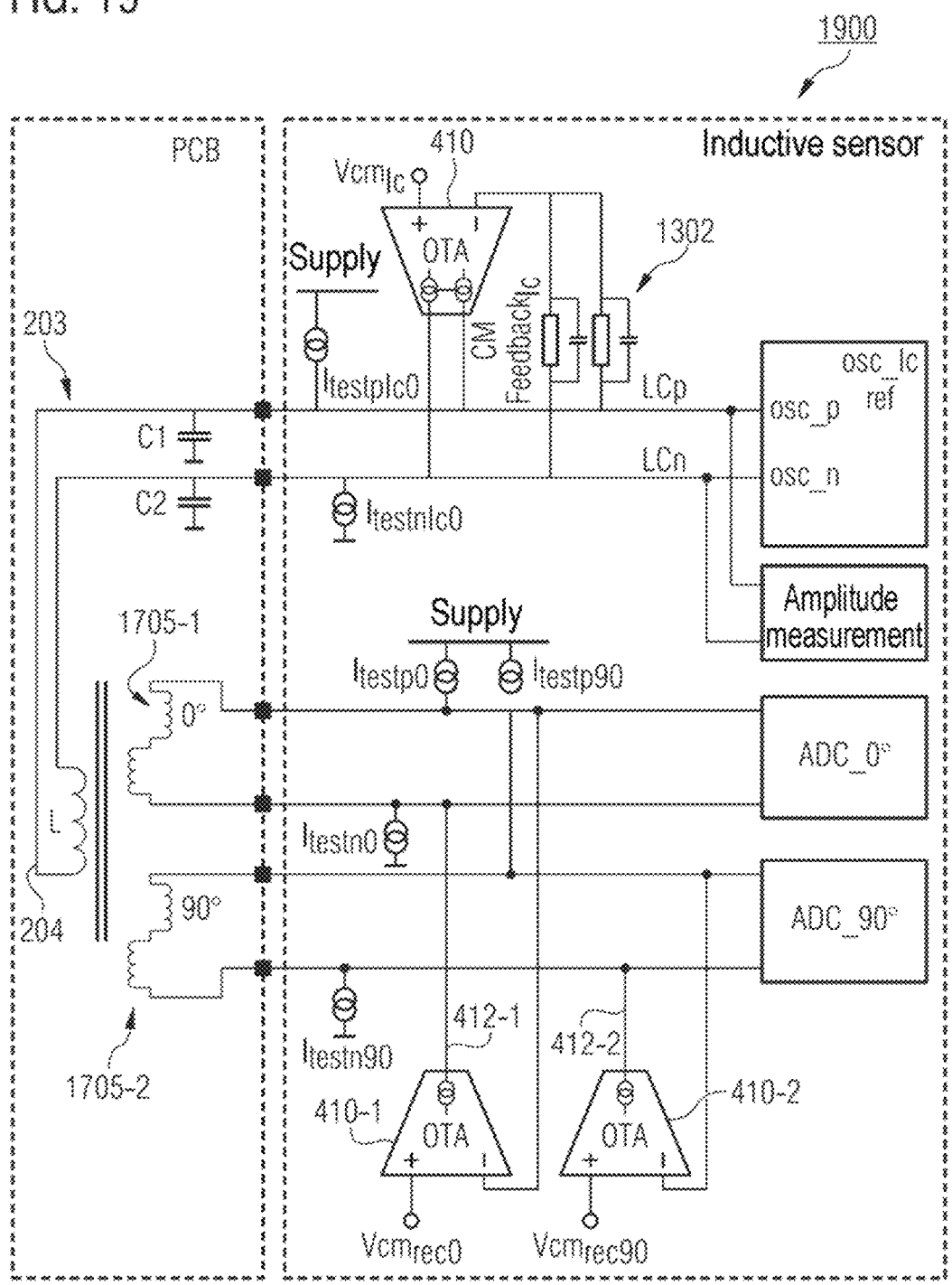
FIG. 19 shows open-circuit and short-circuit identification at the inputs of a two-phase inductive sensor having 2 differential inputs using overload identification in an analog common-mode control loop.

FIG. 18 shows, in summary, a circuit arrangement 1800 with analog common-mode signal control loops comprising transconductance amplifiers 410, both on the exciter side and on the sensor side. As will be apparent following the explanations above, detection of line short circuits and/or line interruptions can be carried out both in an analog manner and digitally. While FIG. 18 shows an example implementation with a sensor-side common-mode control loop, FIG. 19 shows an example implementation of an inductive sensor 1900 with two different sensor-side common-mode control loops for different common-mode potentials.

Figure 20:
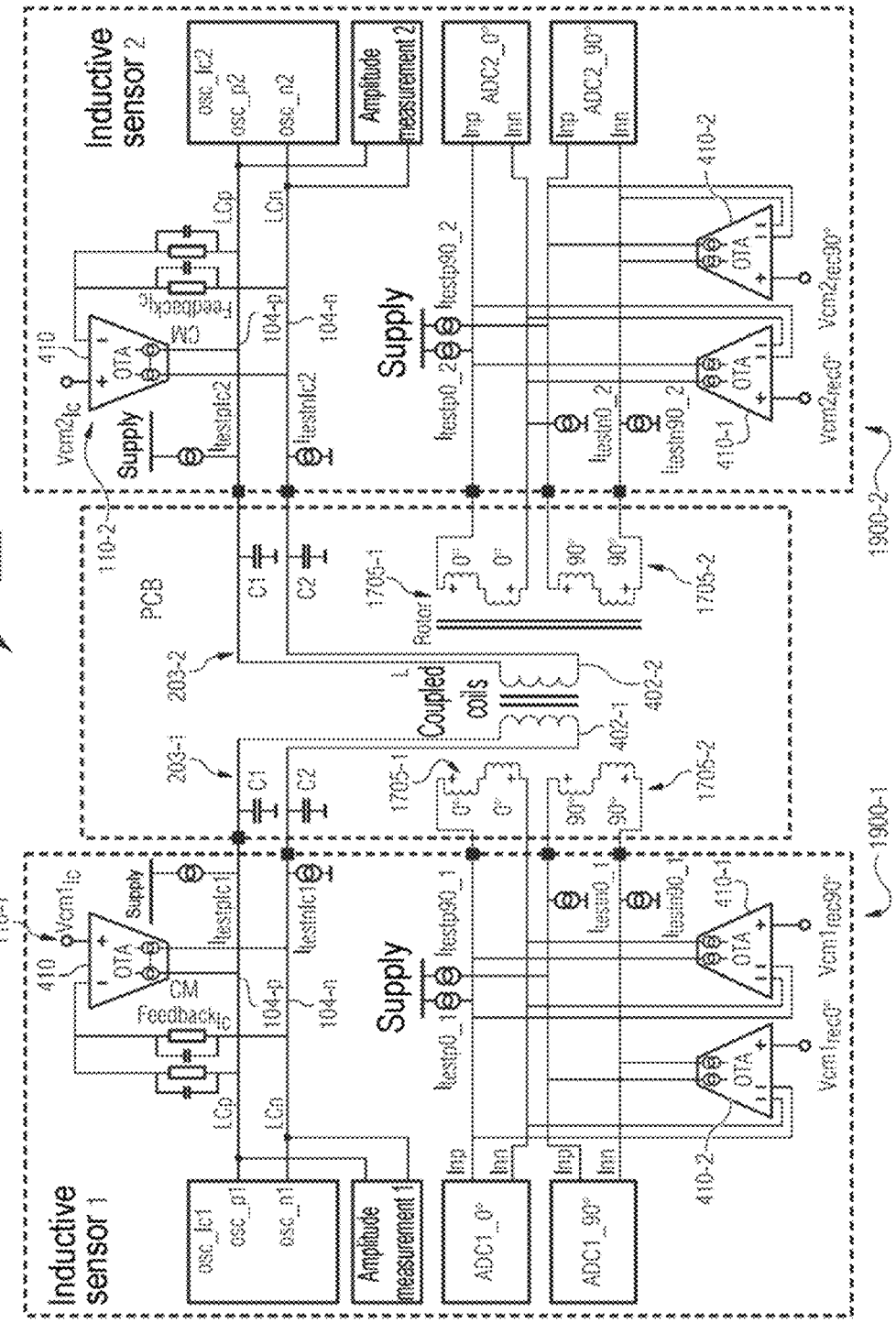
FIG. 20 shows a further example implementation of a functionally safe inductive sensor system having inductively coupled, but galvanically isolated exciter coils.

FIG. 20 shows one example implementation of a functionally safe inductive angle sensor 2000 constructed with redundancy but having inductively coupled, but galvanically isolated transmission coils 204-1, 204-2, which can be operated optionally at different common-mode potentials on the exciter coil side using respective common-mode control loops 110-1, 110-2 on the exciter coil side. The functionally safe inductive angle sensor 2000 constructed with redundancy comprises a first inductive sensor 1900-1 and a second inductive sensor 1900-2. As already shown with reference to FIG. 19, each of the two inductive sensors 1900-1, 1900-2 has in each case two different common-mode control loops on the sensor coil side with transconductance amplifiers 410-1, 410-2 for different common-mode potentials on the sensor coil side.

While predominantly example implementations concerning the detection of line interruptions and/or line short circuits on the exciter side and sensor side of an inductive angle sensor have been discussed with reference to the previous figures, example implementations concerning an identification of increased line resistance in coils for inductive angle sensors will be discussed with reference to the subsequent figures. All herein described example implementations concerning the detection of line interruptions and/or line short circuits and concerning the identification of increased line resistance can be combined with one another.

Both exciter and sensor coils of an inductive angle sensor can be arranged externally, that is to say outside, with respect to a sensor IC (IC=integrated circuit) on a printed circuit board (PCB). The external exciter and/or sensor coils can be connected to multi-layered PCBs using terminal pins by way of soldered joints and PCB vias. Simulations have shown that the accuracy of an angle sensor is impaired if a total resistance of coil and connection (soldered joints) is higher than 100 ohms, for example. This applies both to the sensor coils and to the transmitter coils. A typical value of the coil+connection is ~10 ohms, for example.

Figure 21:
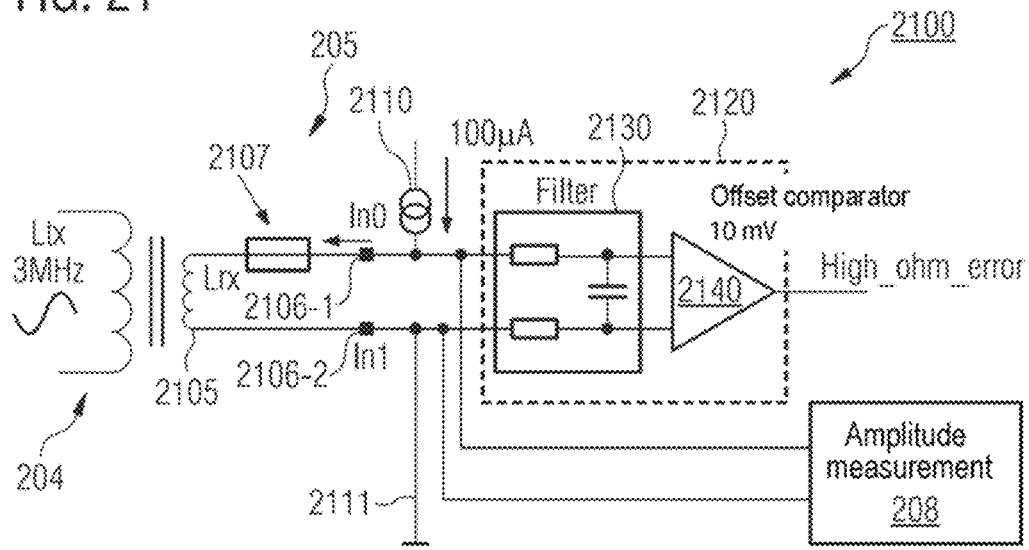
FIG. 21 shows a schematic circuit illustration for identifying increased line resistance in a coil for inductive (angle) sensors.

FIG. 21 shows one example implementation of a circuit arrangement 2100 that can be used for identifying an increased line resistance in the case of coils for inductive angle sensors.

Besides the exciter coil indicated by reference sign 204, primarily the sensor coil arrangement 205 with the (integrated) evaluation circuit 208 already mentioned above is illustrated in FIG. 21. FIG. 21 shows merely by way of example a 1-phase sensor coil arrangement 205. The sensor coil arrangement 205 here has one differentially operated external sensor coil 2105. It will be immediately apparent to the person skilled in the art that the concept illustrated in FIG. 21 is also applicable to multiphase sensor coil arrangements, such that, from phase-shifted induction signals resulting therefrom, the evaluation circuit 208 can determine the rotation angle φ. The external sensor coil 2105 is connected to a sensor IC (not illustrated) by way of terminals (e.g. soldered connections) 2106-1, 2106-2. A terminal or line resistance that arises as a result is identified by reference sign 2107 between sensor coil 2105 and terminal 2106-1. In the case of a poor or faulty soldered connection, the line resistance 2107 can assume excessively high values and thus adversely impair the accuracy, of the angle sensor.

In order to identify increased line resistance in coils for inductive angle sensors, an injection current source 2100 is provided in the circuit arrangement 2110 in order to inject a DC current (here for example 100 μA) into the sensor coil 2105. For this purpose, the injection current source 2110 is coupled to terminal 2106-1. The injected DC current or injection current flows by way of line resistance 2107 and external sensor coil 2105 back into the IC terminal 2106-2, which is coupled to a reference potential (e.g. ground) 2111. On the chip side, a registering circuit 2120 is also coupled to the two terminals 2106-1, 2106-2, the registering circuit being configured to determine a voltage drop across terminals 2106-1, 2106-2, the voltage drop being caused by the injection current.

The registering circuit 2120 comprises an (e.g., RC) low-pass filter 2130 coupled to the terminals 2106-1, 2106-2, and a comparator 2140 coupled to the low-pass filter 2130 on the output side. AC signals induced in the sensor coil 2105 by the exciter coil 204 via a target arrangement (the exciter coil transmits here at 3 MHz, for example) can be filtered out by way of the low-pass filter 2130. Only the offset signal originating from the DC current of the injection current source 2110 is transmitted by the low-pass filter 2130 and can then be evaluated by the comparator 2140. If a DC voltage different between the terminals 2106-1, 2106-2 lies above a predefined threshold value, the comparator 2140 can indicate a fault signal at its output, the fault signal then indicating an excessively high line resistance 2107. The low-pass filter 2130 can damp the high-frequency amplitude (e.g. up to 100 mV) in order to enable an accurate offset measurement. By way of example, an offset comparator threshold value is set to 10 mV in order to identify line resistances 2107 of greater than 100 ohms.

The evaluation of the high-frequency induction signals by the evaluation circuit 208 for the rotation angle φ is not affected by the DC current or injection current of the injection current source 2110.

Figure 22:
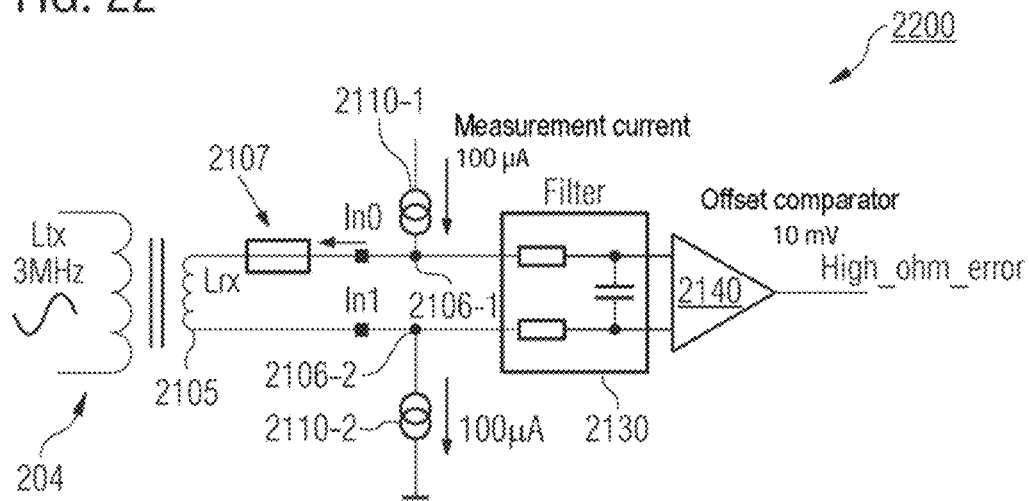
FIG. 22 shows a further schematic circuit illustration for identifying increased line resistance in a coil for inductive (angle) sensors.

The DC current or injection current can be added in various ways. It can be reused for example within the scope of the DC current from the common-mode control described above for the interruption/short circuit identification. FIG. 22 shows an example implementation which is similar to FIG. 21 and in which the ground terminal 2111 from FIG. 21 is replaced by a compensation current source 2110-2, which at terminal 2106-2 compensates the predefined DC current fed into terminal 2106-1 by way of the DC current source 2110-1. The compensation current source 2110-2 can correspond for example to one of the compensation current sources from the example implementations in FIGS. 11 to 20. Otherwise the circuit arrangement 2200 in FIG. 22 functions in a similar manner to the circuit arrangement 2100.

Figure 23:
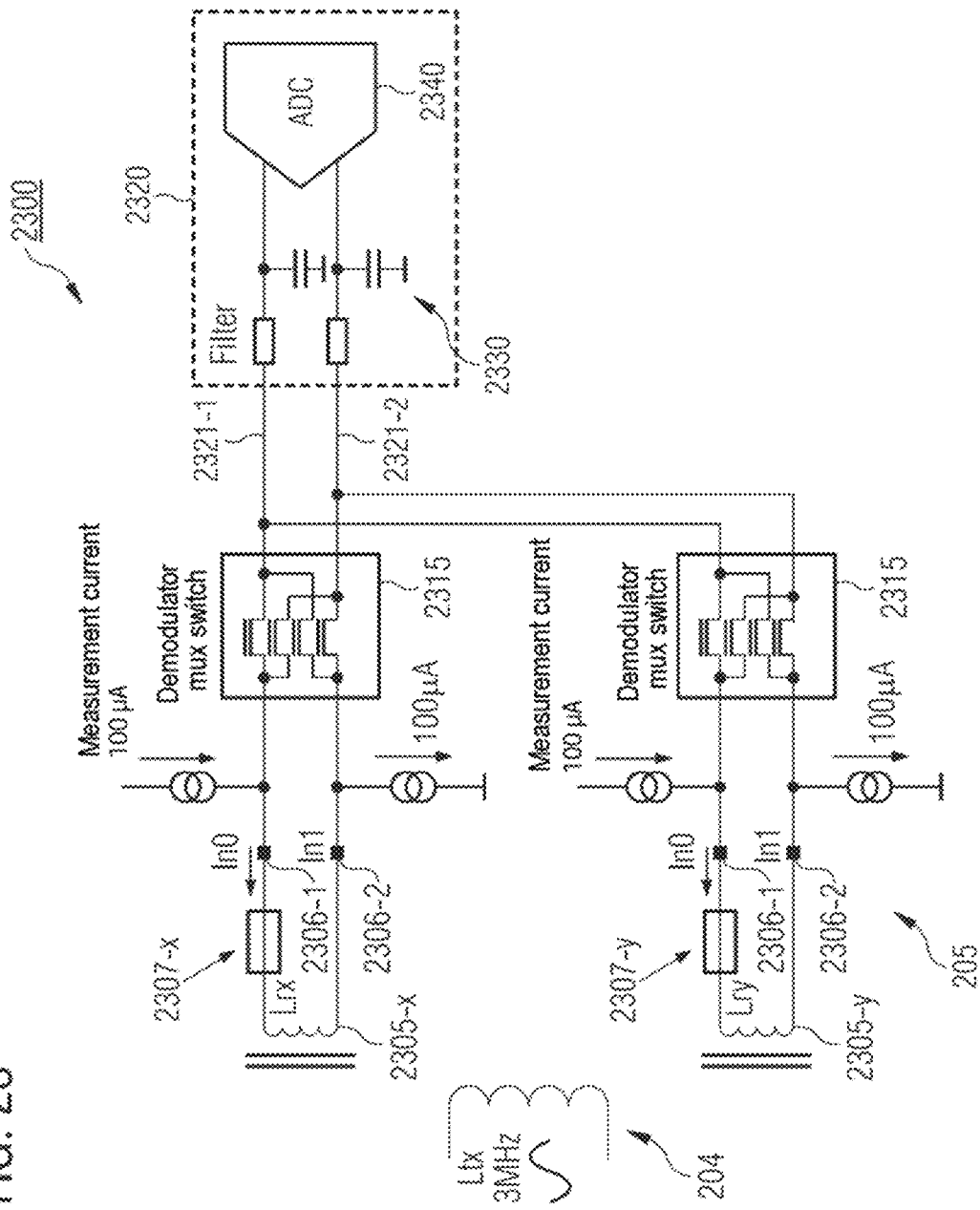
FIG. 23 shows a schematic circuit illustration for identifying increased line resistance in two sensor coils with demodulator circuits.

FIG. 23 shows a further example implementation of a circuit arrangement 2300 for an inductive angle sensor, which circuit arrangement makes it possible to identify an increased line resistance in sensor coils.

FIG. 23 shows a 2-phase sensor coil arrangement 205, for example. The sensor coil arrangement 205 here comprises two sensor coils 2305-x, 2305-y operated in common-mode fashion. The sensor coils 2305-x, 2305-y can be arranged offset by 90° in relation to the rotor 202. From the phase-shifted induction signals resulting therefrom, the evaluation circuit (not illustrated) can determine the rotational angle φ. Both (external) sensor coils 2305-x, 2305-y are connected to the sensor chip in each case via a terminal pair 2306-1, 2306-2. As has already been described, a DC current or injection current is fed to both sensor coils 2305-x, 2305-y in each case by way of a DC current source 2110-1, the current being compensated in each case using a compensation current source 2110-2 at the output source 2306-2 in accordance with FIG. 23, with the result that the injected DC current does not affect differential signal routing between the terminals 2306-1, 2306-2.

On the chip side a respective demodulator circuit 2315 is coupled to the terminals 2306-1, 2306-2 of the sensor coils 2305-$x$, 2305-$y$. The demodulator circuits 2315 each have two operating modes: a first operating mode for angle measurement and a second operating mode for determining the voltage drop across the terminals 2306-1, 2306-2 of the respective sensor coil 2305-$x$, 2305-$y$. In the first operating mode, during a first switching phase, the demodulator circuits 2315 switch the first terminal 2306-1 of the sensor coil 2305-$x$, 2305-$y$ to a first input 2321-1 of the registering circuit 2320 and a second terminal 2306-2 of the sensor coil 2305-$x$, 2305-$y$ to a second input 2321-2 of the registering circuit 2320. During a second switching phase in the first operating mode, the demodulator circuits 2315 switch the first terminal 2306-1 of the sensor coil 2305-$x$, 2305-$y$ to the second input 2321-2 of the registering circuit 2320 and the second terminal 2306-2 of the sensor coil 2305-$x$, 2305-$y$ to the first input 2321-1 of the registering circuit 2320. In this case, a switching cycle comprising first and second switching phases corresponds to 1/f, where f is the frequency of the exciter resonant circuit. In the first operating mode, the induced AC signals are thus rectified by the demodulator circuits 2315 and subsequently smoothed by the low-pass filter 2330 arranged on the output side with respect to the demodulator circuit 2315 before amplitude values are determined by the ADC 2340 arranged on the output side with respect to the low-pass filter 2330.

In the second operating mode, the demodulator circuits 2315 in each case switch the first terminal 2306-1 of the sensor coil 2305-$x$, 2305-$y$ permanently to the first input 2321-1 of the registering circuit 2320 and the second terminal 2306-2 of the sensor coils 2305-$x$, 2305-$y$ permanently to the second input 2321-2 of the registering circuit 2320. The low-pass filter 2330 then filters AC signals induced in the sensor coils 2305-$x$, 2305-$y$ by the exciter coil 204 via the target (the exciter coil here transmits at 3 MHz, for example) and the ADC detects only the offset voltage caused by the DC current through the sensor coils 2305-$x$, 2305-$y$ as an indication of the respective line resistances 2307-$x$, 2307-$y$.

With an ADC instead of a comparator as in FIG. 21 or 22, it is easier to have a programmable threshold. The switches of the demodulator circuits 2315 make it possible to measure the differential offset of a plurality of sensor coils 2305-$x$, 2305-$y$ in different time slots. For this purpose, the demodulator circuit 2315 of the sensor coil 2305-$x$ can switch the terminals 2306-1, 2306-2 of the sensor coil 2305-$x$ permanently to the inputs 2321-1, 2321-2 of the registering circuit 2320 in a different time slot than the demodulator circuit 2315 of the sensor coil 2305-$y$. Additional demodulator switches make it possible also to measure the differential amplitude by way of the same ADC filter combination. This solution can make possible more expedient digital filters and easily programmable threshold values. The same blocks can also be used for the amplitude measurement when the demodulator is switched on.

Figure 24:
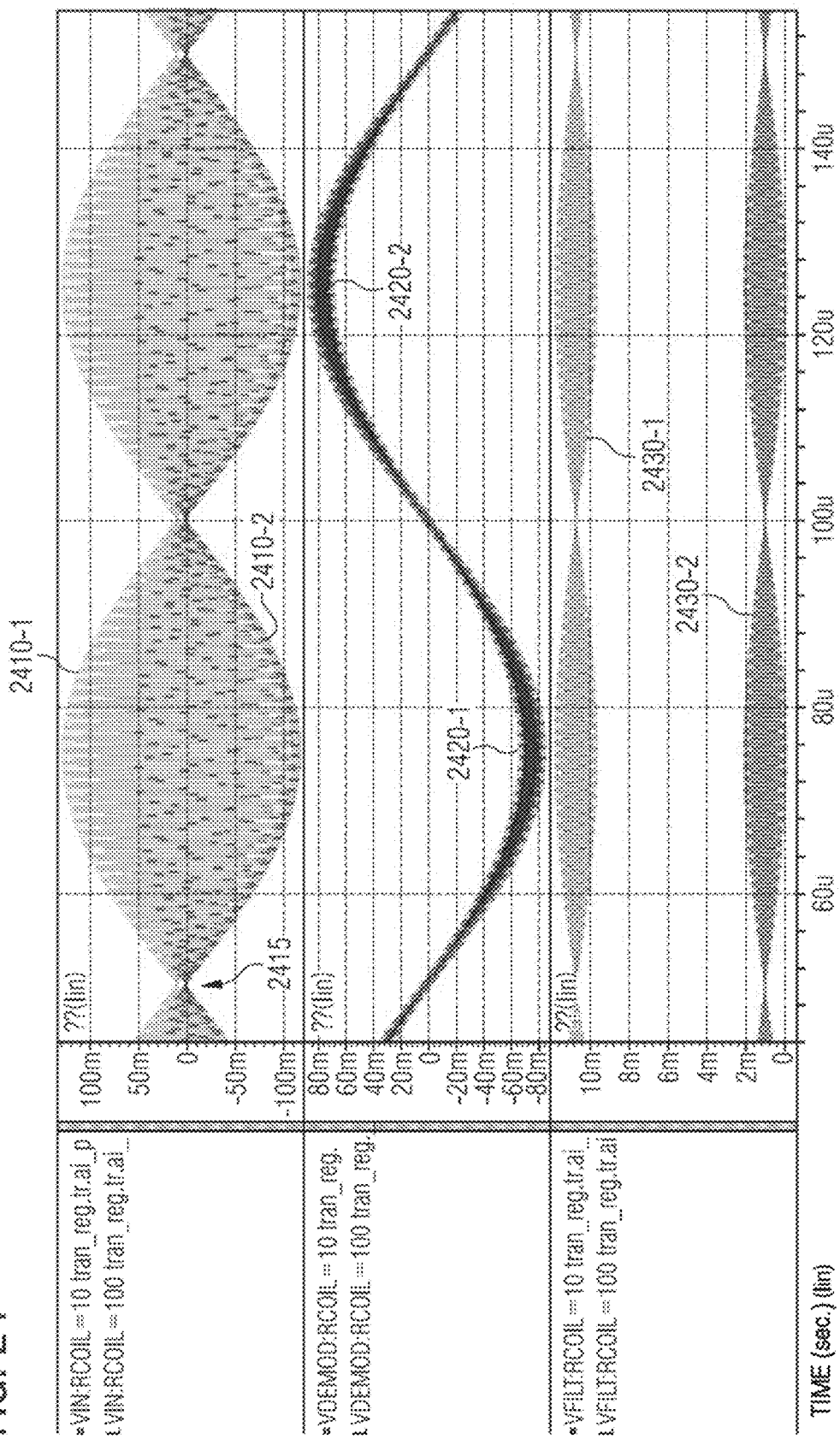
FIG. 24 shows various reception signal profiles (modulated, demodulated, filtered).

FIG. 24 (top) shows two signals 2410-1 and 2410-2, wherein the signal 2410-1 denotes a modulated reception signal at sensor coil 2105 with a line resistance of 100 ohms and the signal 2410-2 denotes a modulated reception signal at sensor coil 2105 with a line resistance of 10 ohms. The high-frequency oscillations in the signals 2410-1 and 2410-2 denote a transmission frequency (e.g., 3 MHz) of the exciter coil 204. The envelopes of the signals 2410-1 and 2410-2 oscillating at lower frequency denote a rotational frequency of a target arrangement. A DC voltage offset of the signal 2410-1 vis-à-vis the signal 2410-2 can be discerned at 2415. FIG. 24, in the middle, shows the corresponding demodulated signals 2410-1 and 2420-2, which substantially represent the rotation of the target arrangement. FIG. 24 (bottom) shows two signals 2430-1 and 2430-2, wherein the signal 2430-1 denotes a reception signal filtered by the low-pass filter 2130 for a line resistance of 100 ohms and the signal 2430-2 denotes a reception signal filtered by the low-pass filter 2130 for a line resistance of 10 ohms. The DC voltage offset of the signal 2430-1 is at approximately 12 mV, and the DC voltage offset of the signal 2430-2 is at approximately 1 mV.

It will immediately be apparent to the person skilled in the art that the concept described here for sensor coils can be used to measure at the transmission coil 204, too, with the demodulator switched off, an increased line resistance with additional DC currents and the amplitude measurement. If a demodulator in the amplitude measuring block is turned off, the differential offset produced by the DC current by way of the coils can be measured, the offset being proportional to the line resistance.

An inductive angle sensor in accordance with example implementations can thus comprise an oscillator circuit 402 (see, e.g., FIG. 9) configured to differentially operate an LC exciter resonant circuit 203 having an exciter coil 204. An injection current source, such as e.g. the current sources 910-$p$, 910-$n$, can be configured to inject a DC current into the differentially operated LC exciter resonant circuit 203 or the exciter coil 204. A voltage drop across terminals of the exciter coil 204, the voltage drop being caused by the DC current, can be determined by a registering circuit (e.g., within the oscillator circuit 402).

In order to identify increased line resistance in coils, it is thus proposed to send a constant current via the coils. By the filters, an average voltage can be produced and an excessively high coil resistance can be identified in the event of a voltage threshold being exceeded. This may be an important safety mechanism for identifying off-chip faults in inductive sensors.

The aspects and features that have been described in association with a specific one of the implementations above can also be combined with one or more of the further implementations in order to replace an identical or similar feature of this further implementation or in order additionally to introduce the feature into the further implementation.

Implementations can furthermore be or relate to a (computer) program comprising a program code for carrying out one or more of the above methods when the program is executed on a computer, a processor, or some other programmable hardware component. Steps, operations, or processes of various methods from among those described above can thus also be performed by programmed computers, processors, or other programmable hardware components. Implementations can also cover program storage devices, e.g., digital data storage media, which are machine-, processor-, or computer-readable and code or contain machine-executable, processor-executable or computer-executable programs and instructions. The program storage devices can comprise or be e.g., digital memories, magnetic storage media such as, for example, magnetic disks and magnetic tapes, hard disk drives or optically readable digital data storage media. Further examples can also cover computers, processors, control units, (field) programmable logic arrays ((F)PLAs), (field) programmable gate arrays ((F) PGAs), graphics processor units (GPUs), application-specific integrated circuits (ASICs), integrated circuits (ICs) or systems-on-a-chip (SOCs) which are programmed to carry out the steps of the methods described above.

It furthermore goes without saying that the disclosure of a plurality of steps, processes, operations or functions disclosed in the description or the claims should not be interpreted as being mandatorily in the order described, unless this is explicitly indicated or absolutely necessary for technical reasons in an individual case. Therefore, the preceding description does not limit the implementation of a plurality of steps or functions to a specific order. Furthermore, in further examples, an individual step, an individual function, an individual process or an individual operation can include a plurality of partial steps, functions, processes or operations and/or be subdivided into them.

Where some aspects in the preceding sections have been described in association with a device or a system, these aspects should also be understood as a description of the corresponding method. In this case, for example, a block, a device or a functional aspect of the device or of the system can correspond to a feature, for instance a method step, of the corresponding method. Analogously thereto, aspects described in association with a method should also be understood as a description of a corresponding block, a corresponding element, a property or a functional feature of a corresponding device or a corresponding system.

The claims that follow are hereby incorporated in the detailed description, where each claim can be representative of a separate example by itself. Furthermore, it should be taken into consideration that—although a dependent claim refers in the claims to a specific combination with one or more other claims—other examples can also encompass a combination of the dependent claim with the subject matter of any other dependent or independent claim. Such combinations are hereby explicitly proposed, provided that in an individual case no indication is given that a specific combination is not intended. Furthermore, features of a claim are also intended to be included for any other independent claim, even if this claim is not directly defined as being dependent on this other independent claim.

The invention claimed is:

1. A circuit for detecting a line short circuit and/or a line interruption in a differentially operated line network, comprising:
at least one control circuit configured to:
control at least one common-mode signal of the differentially operated line network vis-à-vis a predefined common-mode signal variable, and
indicate at least one of a line short circuit in the differentially operated line network or a line interruption in the differentially operated line network when at least one control or controlled variable exceeds a predefined threshold value.

2. The circuit as claimed in claim 1, wherein the at least one control circuit is configured as an analog control circuit.

3. The circuit as claimed in claim 1, wherein the at least one control circuit has a transconductance amplifier having at least one feedback output for a control current, wherein the at least one feedback output is configured to feed the control current back to one or more of a common-mode signal source of the differentially operated line network or a signal line of the differentially operated line network.

4. The circuit as claimed in claim 3, wherein the transconductance amplifier has a plurality of feedback outputs for a plurality of signal lines of the differentially operated line network.

5. The circuit as claimed in claim 3, wherein the transconductance amplifier has one feedback output for the common-mode signal source.

6. The circuit as claimed in claim 3, wherein the at least one control circuit has a current comparison circuit configured to:
compare the control current provided via the at least one feedback output of the transconductance amplifier with at least one predefined threshold current provided via at least one current source, and
indicate at least one of a line short circuit or a line interruption in the differentially operated line network when the control current exceeds the predefined threshold current in terms of absolute value.

7. The circuit as claimed in claim 3, wherein the at least one control circuit has a detection circuit configured to:
ascertain whether one or more transistors of at least one current source of the transconductance amplifier for providing the control current via the at least one feedback output leaves a saturation region, and
indicate at least one of a line short circuit or a line interruption in the differentially operated line network when the saturation region is left.

8. The circuit as claimed in claim 1, wherein the at least one control circuit is configured as a digital control circuit.

9. The circuit as claimed in claim 8, wherein the at least one control circuit comprises:
an analog-to-digital converter (ADC), an input of the ADC being coupled to a differentially operated line pair of the differentially operated line network;
a digital signal processing circuit configured to:
compare common-mode signals of the differentially operated line pair that have been subjected to analog-to-digital conversion using the ADC with a common-mode signal setpoint variable, and
determine a digital control signal based on comparing the common-mode signals of the differentially operated line pair that have been subjected to the analog-to-digital conversion using the ADC with the common-mode signal setpoint variable; and
a feedback path for the digital control signal with a digital-to-analog converter (DAC), for controlling a common-mode signal source of the differentially operated line pair.

10. The circuit as claimed in claim 1, furthermore comprising:
at least one injection current source configured to inject, in addition to the at least one common-mode signal, at least one direct current (DC) current or at least one alternating current (AC) current into the differentially operated line network without affecting differential signal routing.

11. The circuit as claimed in claim 10, wherein the at least one injection current source is configured as switchable, in order to be applied alternately to different signal lines of the differentially operated line network.

12. The circuit as claimed in claim 1, wherein the differentially operated line network comprises a differentially operated inductor capacitor (LC) exciter resonant circuit of an inductive angle sensor.

13. The circuit as claimed in claim 1, wherein the differentially operated line network comprises a plurality of differentially operated sensor coils of an inductive angle sensor.

14. An inductive angle sensor, comprising:
- an inductor capacitor (LC) exciter resonant circuit, wherein the LC exciter resonant circuit is differentially operated using an integrated oscillator circuit; and
- a control circuit configured to:
  - control a common-mode signal for the LC exciter resonant circuit vis-à-vis a predefined common-mode signal variable, and
  - indicate at least one of a line short circuit or a line interruption in the LC exciter resonant circuit when at least one control or controlled variable exceeds a predefined threshold value.

15. The inductive angle sensor as claimed in claim 14, wherein the control circuit has a transconductance amplifier coupled to the differentially operated LC exciter resonant circuit on an input side and having at least one feedback output for a control current which is fed back to at least one of the integrated oscillator circuit or at least one signal line of the differentially operated LC exciter resonant circuit.

16. The inductive angle sensor as claimed in claim 15, wherein the transconductance amplifier has a feedback output for each signal conductor of a signal line pair of the differentially operated LC exciter resonant circuit, or wherein the transconductance amplifier has exactly one feedback output for the integrated oscillator circuit.

17. The inductive angle sensor as claimed in claim 14, wherein the control circuit comprises:
- an analog-to-digital converter (ADC), wherein an input of the ADC is coupled to a line pair of the differentially operated LC exciter resonant circuit;
- a digital signal processing circuit configured to compare common-mode signals of the line pair that have been subjected to analog-to-digital conversion using the ADC with a common-mode signal setpoint variable and to determine a digital control signal based on comparing the common-mode signals of the line pair that have been subjected to the analog-to-digital conversion using the ADC with the common-mode signal setpoint variable; and
- a feedback path for the digital control signal with a digital-to-analog converter (DAC) for converting the digital control signal into an analog control current for the integrated oscillator circuit.

18. The inductive angle sensor as claimed in claim 14, furthermore comprising
- for each signal conductor of a signal line pair of the differentially operated LC exciter resonant circuit, a direct current (DC) current source configured to inject, in addition to the common-mode signal, a DC current into a respective signal conductor, without affecting differential signal routing in the differentially operated LC exciter resonant circuit.

19. An inductive angle sensor, comprising:
- a plurality of differentially operated sensor coils arranged in a phase-offset manner; and
- a control circuit configured to control at least one common-mode signal of the plurality of differentially operated sensor coils vis-à-vis a predefined common-mode signal variable and to indicate at least one of a line short circuit or a line interruption for the plurality of differentially operated sensor coils when at least one control or controlled variable exceeds a predefined threshold value.

20. The inductive angle sensor as claimed in claim 19, furthermore comprising:
- for each of the plurality of differentially operated sensor coils, a direct current (DC) current source configured to inject, in addition to the respective common-mode signal, a DC current into a respective signal line, without affecting differential signal routing in the plurality of differentially operated sensor coils.

21. The inductive angle sensor as claimed in claim 20, wherein each of the DC current sources is switchable alternately to different sensor coils from among the differentially operated sensor coils.

22. The inductive angle sensor as claimed in claim 20, wherein the control circuit has a transconductance amplifier coupled to the plurality of differentially operated sensor coils on an input side and having at least one feedback output for a control current which is fed back to at least one signal line of the plurality of differentially operated sensor coils.

23. The inductive angle sensor as claimed in claim 22, wherein the feedback output is switchable alternately to different sensor coils from among the plurality of differentially operated sensor coils.

24. The inductive angle sensor as claimed in claim 19, furthermore comprising:
- an evaluation circuit, wherein the evaluation circuit is coupled to the plurality of differentially operated sensor coils arranged in a phase-offset manner and is configured to determine a rotation angle of an inductive rotor arrangement based on induction signals of the plurality of differentially operated sensor coils.

25. The inductive angle sensor as claimed in claim 24, wherein the evaluation circuit is furthermore configured to indicate, based on at least one common-mode signal of the plurality of differentially operated sensor coils arranged in the phase-offset manner, at least one of a line short circuit or a line interruption for the plurality of differentially operated sensor coils when at least one of the at least one common-mode signal leaves a predefined tolerance range.

26. An inductive angle sensor comprising:
- at least one differentially operated coil;
- an injection current source configured to inject a direct current (DC) current into the at least one differentially operated coil; and
- a registering circuit configured to determine a voltage drop across terminals of the at least one differentially operated coil that is caused by the DC current,
  wherein at least one of:
  - the injection current source is configured to inject the DC current into the at least one differentially operated coil without the injected DC current affecting differential signal routing,
  - the registering circuit is configured to output a fault signal when the voltage drop across the terminals of the at least one differentially operated coil exceeds a predefined threshold value, or
  - the registering circuit has a low-pass filter configured to suppress alternating current (AC) signals.

27. The inductive angle sensor as claimed in claim 26, wherein the injection current source is configured to inject the DC current into the at least one differentially operated coil without the injected DC current affecting differential signal routing.

28. The inductive angle sensor as claimed in claim 26, wherein the registering circuit is configured to output the fault signal when the voltage drop across the terminals of the at least one differentially operated coil exceeds the predefined threshold value.

29. The inductive angle sensor as claimed in claim 26, wherein the registering circuit has the low-pass filter configured to suppress the AC signals.

30. The inductive angle sensor as claimed in claim 26, comprising:
- a demodulator circuit arranged between the terminals of the at least one differentially operated coil and the registering circuit and configured,
- in a first operating mode for angle measurement,
  - during a first switching phase, to switch a first terminal of the at least one differentially operated coil to a first input of the registering circuit and a second terminal of the at least one differentially operated coil to a second input of the registering circuit and, during a second switching phase, to switch the first terminal of the at least one differentially operated coil to the second input of the registering circuit and the second terminal of the at least one differentially operated coil to the first input of the registering circuit and,
- in a second operating mode for determining the voltage drop across the terminals of the at least one differentially operated coil,
  - to switch the first terminal of the coil permanently to the first input of the registering circuit and the second terminal of the at least one differentially operated coil permanently to the second input of the registering circuit.

31. The inductive angle sensor as claimed in claim 26, furthermore comprising:
- a control circuit configured to control at least one common-mode signal of the at least one differentially operated coil vis-à-vis a predefined common-mode signal variable and to indicate at least one of a line short circuit or a line interruption for the at least one differentially operated coil when at least one control or controlled variable exceeds a predefined threshold value.

* * * * *